United States Patent [19]
Roberts et al.

[11] Patent Number: 5,254,218
[45] Date of Patent: Oct. 19, 1993

[54] MASKING LAYER HAVING NARROW ISOLATED SPACINGS AND THE METHOD FOR FORMING SAID MASKING LAYER AND THE METHOD FOR FORMING NARROW ISOLATED TRENCHES DEFINED BY SAID MASKING LAYER

[75] Inventors: Ceredig Roberts, Boise, Id.; Alan Reinberg, Westport, Conn.

[73] Assignee: Micron Technology, Inc., Boise, Id.

[21] Appl. No.: 872,747

[22] Filed: Apr. 22, 1992

[51] Int. Cl.⁵ .......................................... H01L 21/306
[52] U.S. Cl. .................................. 156/662; 156/657; 437/67; 148/DIG. 50
[58] Field of Search ................... 156/657, 662; 437/67, 437/63; 148/DIG. 50

[56] References Cited

U.S. PATENT DOCUMENTS

| | | | |
|---|---|---|---|
| 4,502,914 | 3/1985 | Trumpp et al. | 156/662 |
| 4,882,291 | 11/1989 | Jeuch | 437/67 |
| 5,047,117 | 9/1991 | Roberts | 156/657 |
| 5,053,105 | 10/1991 | Fox, III | 156/662 |

FOREIGN PATENT DOCUMENTS

| | | | |
|---|---|---|---|
| 0082256 | 6/1983 | European Pat. Off. | |
| 0181639 | 10/1984 | Japan | 437/67 |
| 0114130 | 5/1988 | Japan | 437/67 |
| 0110727 | 4/1989 | Japan | 437/67 |

Primary Examiner—Brian E. Hearn
Assistant Examiner—Trung Dang
Attorney, Agent, or Firm—Susan B. Collier

[57] ABSTRACT

A process for forming within a masking layer self-aligned narrow isolated spacings having a width that is substantially narrower than the space width that can be created directly using the maximum resolution of available photolithography and the process for utilizing said masking layer to form narrow isolated trenches in a semiconductor substrate. The process involves the following steps: creation of a mask island using conventional photomasking and etching techniques, opposing sides of said island defining the inner walls of the narrow isolated spacings; blanket deposition of a spacer layer, the thickness of which is equal to the desired width of the narrow isolated spacings; blanket deposition of a thick protective layer that is independently etchable over the spacer layer; planarization of the protective layer to or below the top of the spacer layer; masking at least a width equal to the thickness of the spacer layer at two opposing ends of the mask island; and isotropically etching the unmasked spacer layer to form the narrow isolated spacings. Said process thereby creating the masking layer having self-aligned narrow isolated spacings exposing the substrate. At this point the mask protecting the opposing end of the mask island may be removed and the exposed substrate may be etched to form narrow isolated trenches.

25 Claims, 27 Drawing Sheets

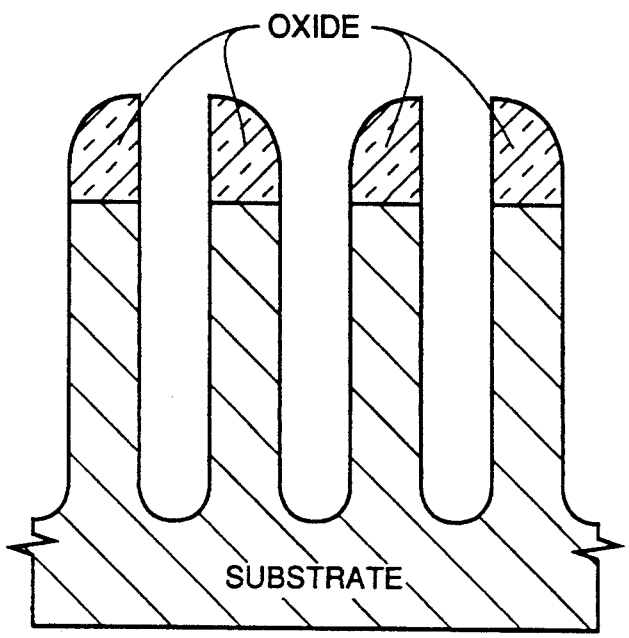
FIG. 3
(PRIOR ART)
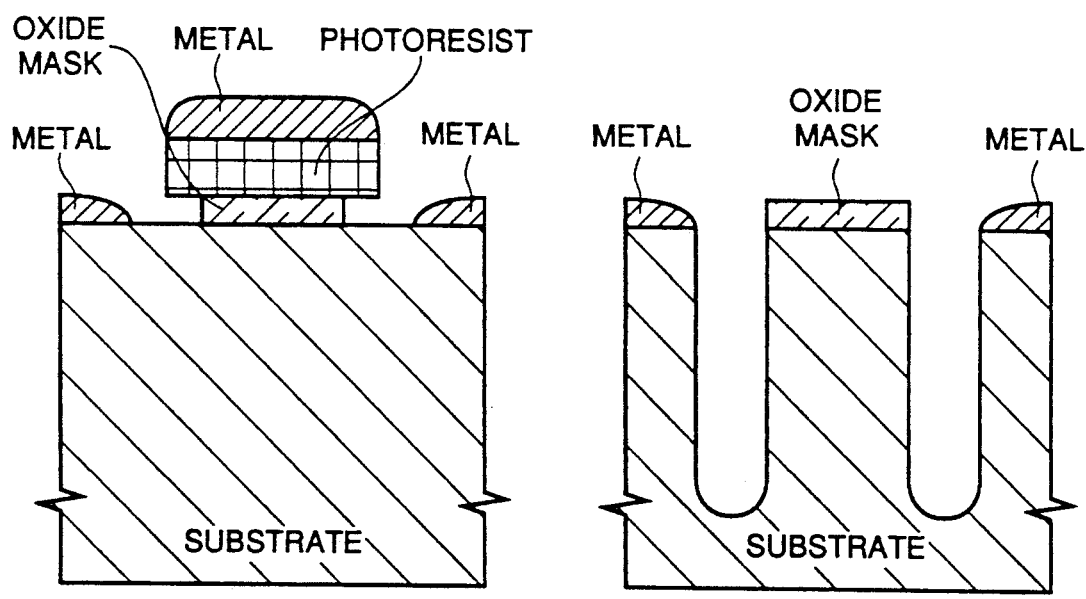
FIG. 4A
(PRIOR ART)
FIG. 4B
(PRIOR ART)

MASKING LAYER HAVING NARROW ISOLATED SPACINGS AND THE METHOD FOR FORMING SAID MASKING LAYER AND THE METHOD FOR FORMING NARROW ISOLATED TRENCHES DEFINED BY SAID MASKING LAYER

FIELD OF THE INVENTION

This invention relates to semiconductor manufacturing technology and, more particularly, to photolithography masking techniques used to provide feature dimensions which transcend the resolution limits of available photolithography.

BACKGROUND OF THE INVENTION

Since the late 1960's, a new generation of integrated circuits has been developed approximately every four years. Each generation has been characterized by a halving of device dimensions, resulting in a four-fold density increase over the preceding generation. Increases in circuit density have been consistently limited by the resolution of the available photolithographic equipment. The minimum size of features and spaces that a given piece of photolithographic equipment can produce is directly related to its resolution capability.

It has long been recognized, by those skilled in the fabrication of integrated circuits, that vertical film layers as thin as $0.01\mu$ can be grown with a high degree of accuracy. Also, layers as thin as $0.1\mu$ can be deposited by low pressure chemical vapor deposition, hereinafter known as LPCVD. By comparison, the minimum feature size, producible with the present generation of photolithography equipment used to produce 1-megabit SRAMs and 4-megabit DRAMs, is approximately $0.6\mu$. If deposition layers can be used to define horizontal dimensions within integrated circuits, the result will be increased circuit density.

Many die are typically fabricated on a singular semiconductor wafer. Complex circuitries are created on each die. Because of increasing device density on die, it is necessary to enhance the isolation of the different devices to ensure that no current flows through the substrate from one device to another. In FIG. 1, two active areas are isolated from each other by a field oxide region that has been thermally grown using a standard Locos process. During field oxide growth, patches of silicon nitride protect future active areas from oxidation. Electrical devices (e.g., transistors, resistors, capacitors) will ultimately be fabricated in the active areas. The oxide layer must be of relatively large width to ensure that there is no leakage current from one area to another. This leakage current is the result of what is termed bipolar latch up in the case where the two regions are of opposite types; that is, one is n type and the other is p type. Similar regions are also susceptible to leakage current.

In order to reduce the horizontal width of the oxide layer and maximize die space, trenches have been created via several processes. The trenches, filled with an insulative material such as silicon dioxide, extend into the substrate and act as insulating walls between active areas. Because trenches extend into the substrate, they can prevent bipolar latch up even though they may be narrower than the field oxide region of FIG. 1. In fact, the width can now be as narrow as present technology allows. FIG. 2 shows a trench manufactured with polycrystalline silicon deposited over an oxide region. The trench width is difficult to precisely predict when using this method due to variations in the polycrystalline silicon deposition. FIG. 3 depicts trench fabrication using an oxide mask created with a pitch doubling process that is the subject of a copending U.S. patent application submitted by Tyler Lowrey and Randal Chance of Micron Technology, Inc. and accorded Ser. No. 519,992, entitled "Method for Reducing, by a Factor of $2^{-N}$, the Minimum Masking Pitch of a Photolithographic Process Used in the Fabrication of an Integrated Circuit." In FIG. 4A an oxide mask is formed by under-etching the photoresist. Next, metal is sputtered onto the wafer. The photoresist shields a portion of the substrate next to the oxide mask from the metal. After the wafer has been sputtered, the metal covering the photoresist is lifted and the photoresist is etched producing a mask of metal and oxide for trench formation, FIG. 4B. There is a percentage of error in the predictability of trench size due to the nature of the sputtering process because of the unpredictable shielding effect of the photoresist. FIGS. 5A and 5B depict trench fabrication that is the subject of U.S. Pat. No. 4,502,914. This invention provides a structure of polymeric material with vertical sidewalls, the latter serving to make sidewall structures of silicon dioxide or nitride with dimensions in the sub-micrometer range. These sidewall structures can be used as masks directly. For the negative lithography, another layer is alternatively applied over the sidewall structures using a planarization which is partly removed until the peaks of the sidewall structures are exposed. Subsequently the sidewall structures themselves are removed. The resulting opening can then be used as a mask for trench formation. Providing uniformity of the planarization layer over the sidewall structures can be difficult using this method due to the fact that the sidewall structures can disrupt the flow of resist or other material during the spin.

Since the trenches are fabricated after the substrate has been exposed, the key to narrow, self-aligned isolation trenches is exposing a highly predictable narrow substrate region. The etch mask fabrication of the present embodiment facilitates even narrower, self-aligned trenches, with a minimum amount of masking steps using a deposition layer as a masking layer to precisely define the narrow spacing.

SUMMARY OF THE INVENTION

This invention utilizes a primary mask of photoresist, created using conventional photolithography, to create a secondary mask, having vertical film layer segments defining narrow isolated spacings. The primary mask patterns a silicon dioxide layer segment, also referred to as a mask island. The silicon dioxide layer segment is part of the secondary mask and two of its opposing sides define the inner walls of the narrow isolated spacings. An expendable spacer layer is deposited on top of the silicon dioxide layer segment and an exposed starting substrate. The starting substrate may be fabricated to overlie other substrates; such would be the case when a silicon substrate is fabricated to overlie a sapphire substrate. This is known as silicon on sapphire (SOS). The thickness of the expendable layer determines the width of the isolated trenches in the secondary mask. The width may be as narrow as $0.1\mu$. The spacer layer may be polycrystalline silicon deposited by LPCVD. A thick protective layer is blanket deposited on top of the spacer layer, the primary consideration being that the spacer layer must be etchable with a high degree of selectivity over the protection layer. A blanket deposition of photoresist follows which results in the planarization of the in-process wafer. The protective layer and photoresist are then plasma etched at the same rate in order to expose the spacer layer adjacent to and capping the silicon dioxide segment, the balance of the spacer layer remaining covered by the protective layer. Next opposing ends of the silicon dioxide layer segment are masked to protect at least a width of the ends equal to the thickness of the spacer layer. At this point, the exposed portions of the spacer layer are etched away to create the narrow isolated spacings and to expose the substrate that is adjacent to the two opposing sides of the silicon dioxide layer segment that was not masked. The foregoing process creates the secondary etch mask. A further aspect of the invention comprising the process of etching narrow isolated trenches in the substrate according to the secondary mask. The narrow isolated trenches formed in the substrate are self-aligned to the two opposing sides of the silicon dioxide layer segment. The two opposing sides of the silicon dioxide layer segment define the inner walls and the remaining spacer layer defines the outer walls of the substrate trenches thus formed.

Because the width of the narrow isolated spacings within the secondary mask is dependent on the thickness of the expendable spacer layer, very narrow trench widths are possible. In addition, the resulting trenches are self-aligned to two opposing sides of the silicon dioxide layer segment. The process is easily adapted to current manufacturing techniques and has minimum manufacturing problems.

This masking technique may be used to create a variety of semiconductor structures.

BRIEF DESCRIPTION OF THE DRAWINGS

FIGS. 2, 3, 4A, 4B, 5A and 5B depict the prior art trench isolation of integrated circuit regions.

FIGS. 6 through 28 depict a portion of an in-process wafer during different process stages of the invention. Figures representing contemporaneous process stages have identical ordinal number designations (e.g., FIGS. 5A and 5B are contemporaneous views). Each "A" view is a cross section through the contemporaneous top planer "B" view.

DETAILED DESCRIPTION OF THE PREFERRED EMBODIMENT

In the semiconductor industry, electronic circuitry is fabricated on silicon substrate. The present invention is a trench mask having narrow isolated spacings and the method for fabricating same. A further aspect of the invention is the method for fabricating narrow isolated trenches in the substrate, said fabricating performed according to the trench mask. The fabrication is very flexible and may be used to pattern a multitude of features within semiconductor circuitry. Although the present embodiment emphasizes the fabrication of a trench mask having two narrow isolated spacings a trench mask having a plurality of narrow isolated spacings may be fabricated. Thus, a plurality of narrow isolated trenches may be fabricated by duplicating the following method pertinent to the fabrication of two narrow isolated trenches.

In FIGS. 6 through 28, the "A" figures represent a cross sectional view of narrow spacing and trench fabrication processes and the "B" figures represent a top planar view of each corresponding figure "A".

Figure 1:
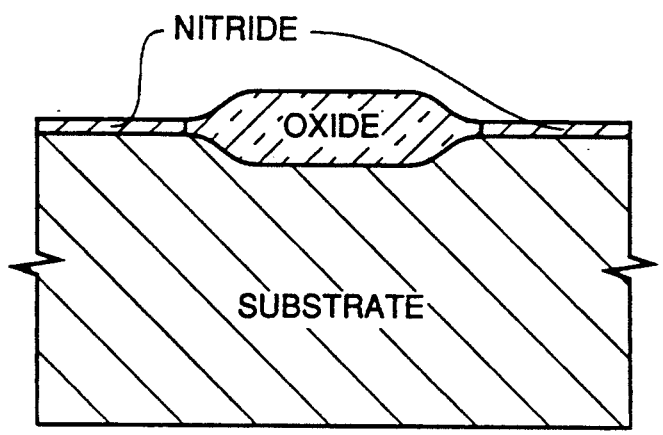
FIG. 1 depicts the prior art isolation of integrated circuit regions.
Figure 2:
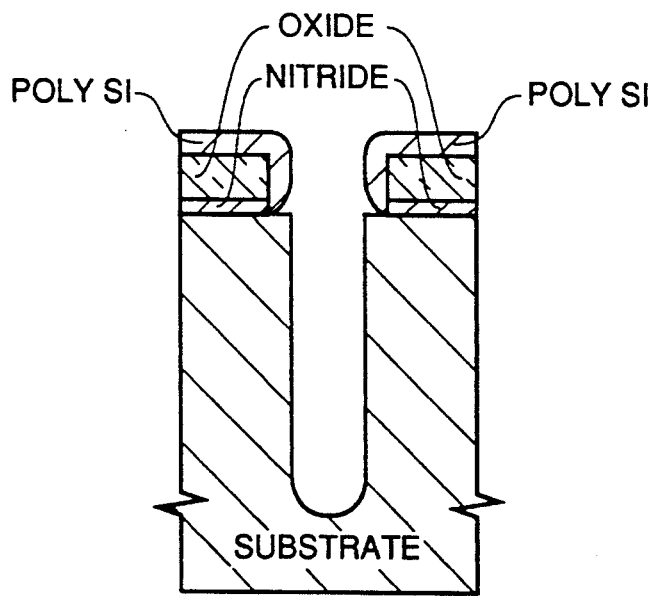
Figure 5A:
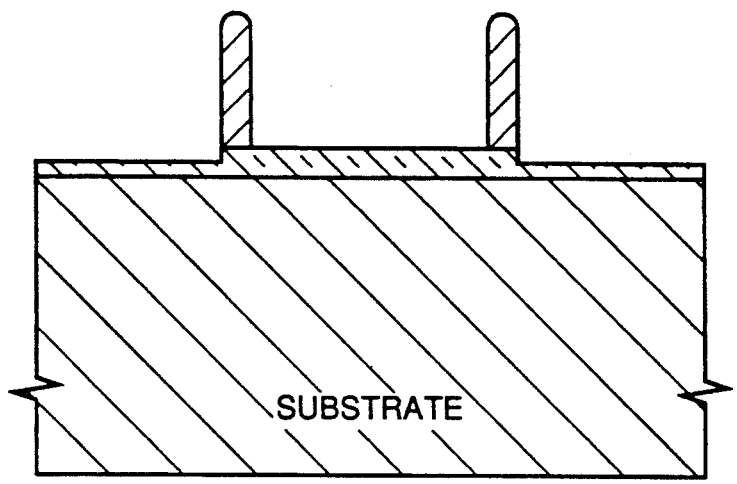
Figure 5B:
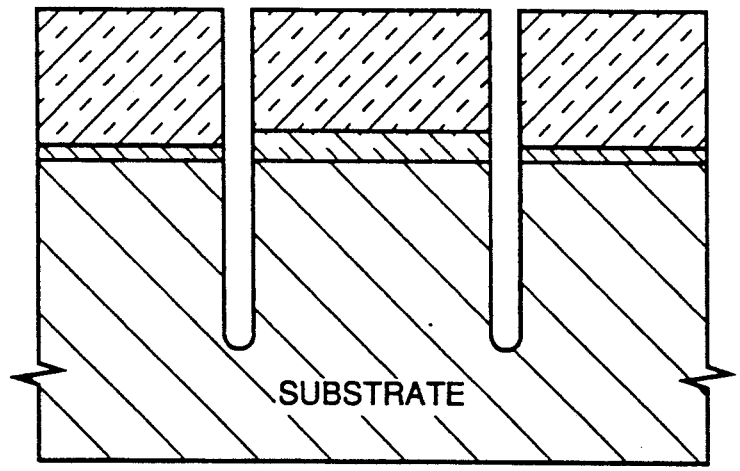
Figure 6A:
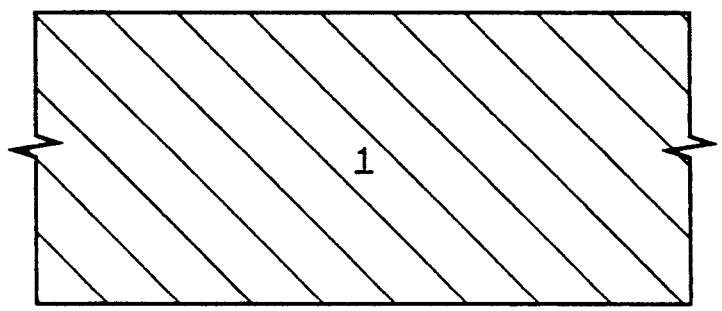
FIGS. 6A and 6B are unprocessed silicon substrate.
Figure 6B:
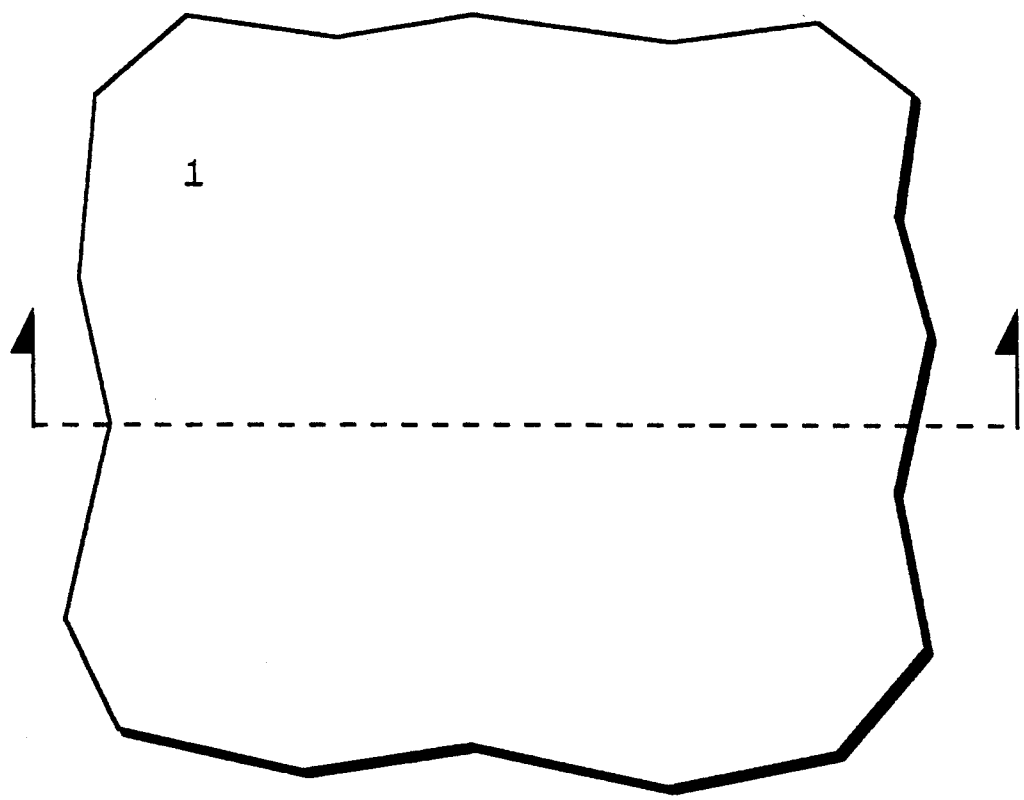

FIGS. 6A and 6B depict a portion of an in-process silicon wafer showing substrate 1.

Figure 7A:
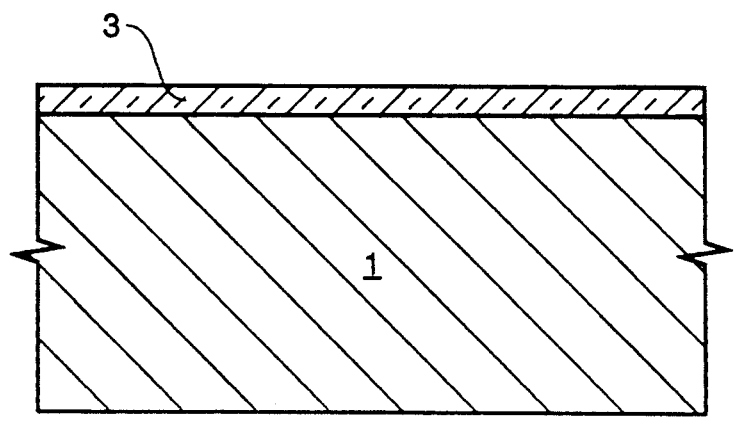
FIGS. 7A and 7B represent the substrate of FIGS. 6A and 6B, respectively, following the thermal growth of a thin-oxide layer.
Figure 7B:
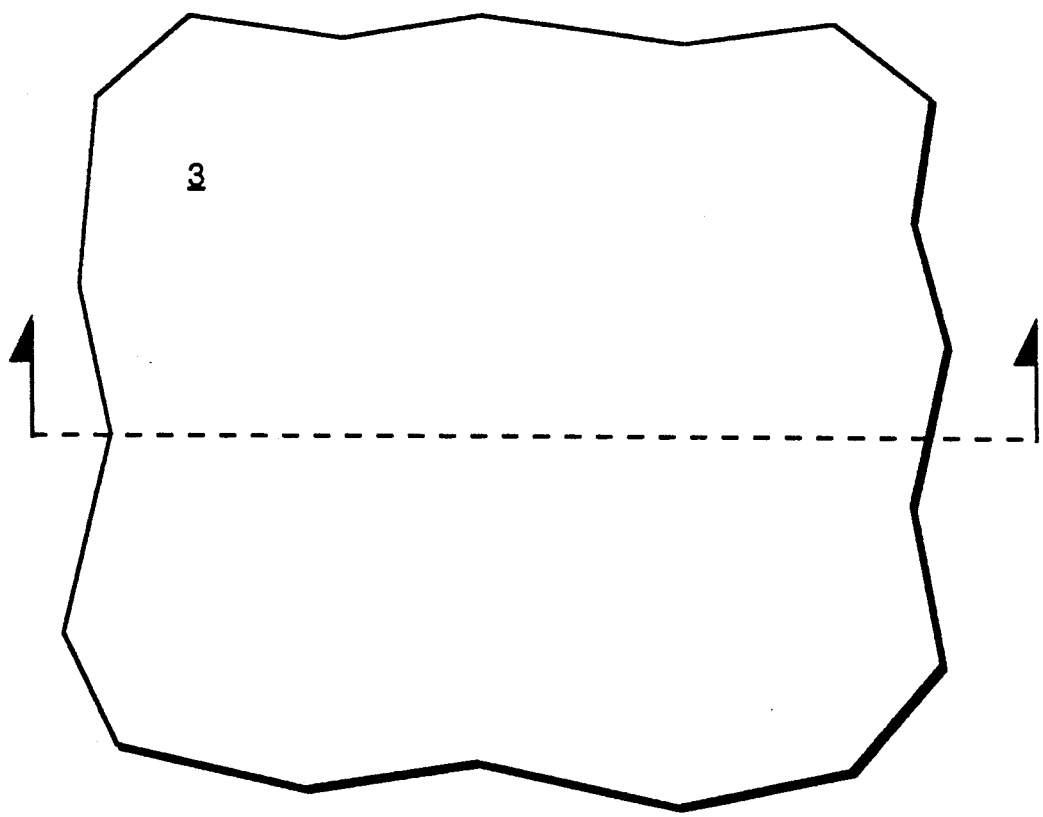

In FIGS. 7A and 7B, a thin oxide layer 3 is thermally grown in a diffusion oven. The thin oxide layer 3 offers protection for the substrate 1 during subsequent layerization and etching.

Figure 8A:
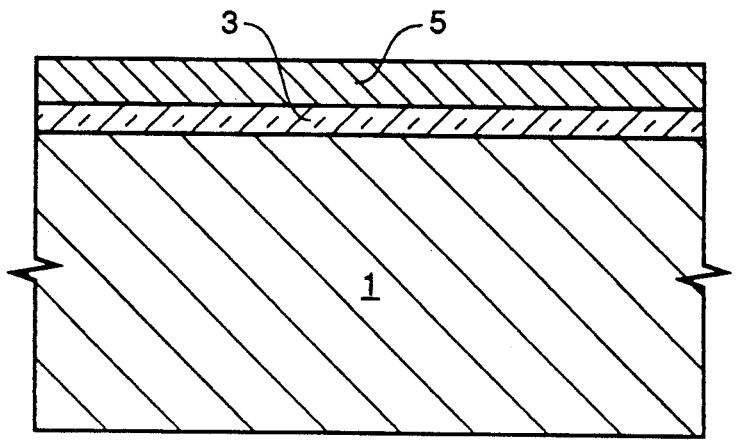
FIGS. 8A and 8B represent the in-process wafer portion of FIGS. 7A and 8A, respectively, following the blanket deposition of nitride.
Figure 8B:
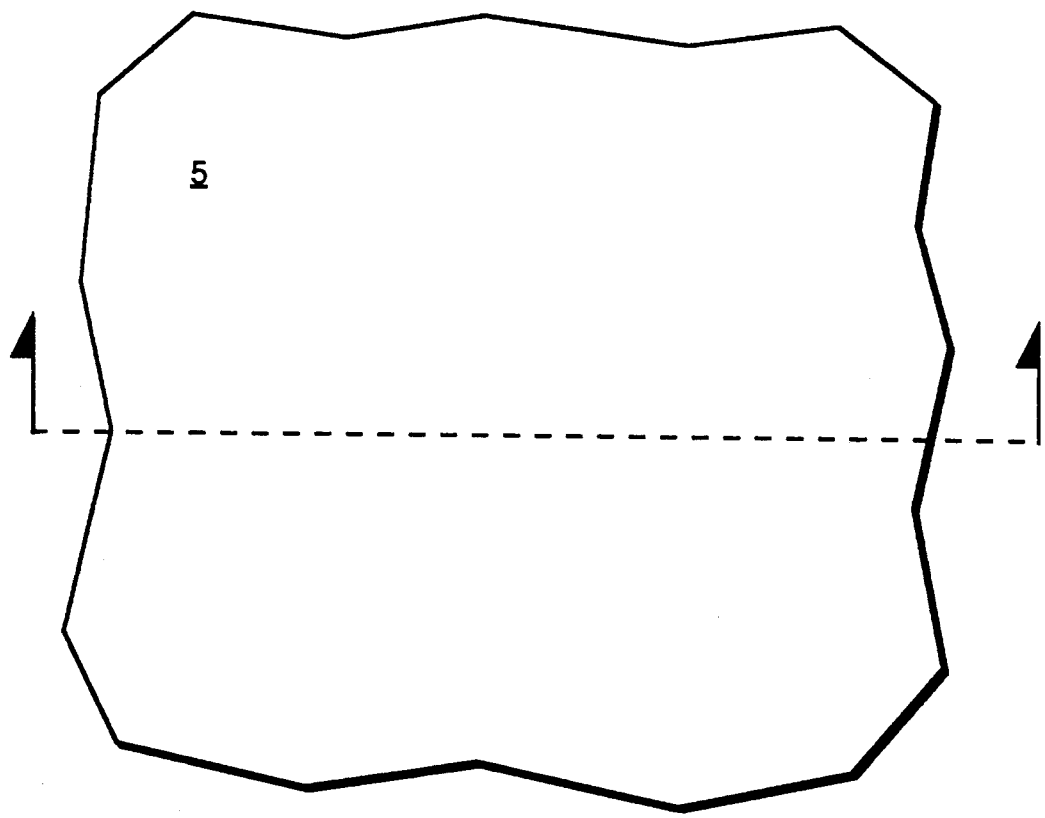

In order to provide a future barrier against oxidation of substrate 1 during subsequent circuit fabrication steps, a nitride layer 5 may be optionally deposited by low pressure chemical vapor deposition (LPCVD) as shown in FIGS. 8A and 8B.

Figure 9A:
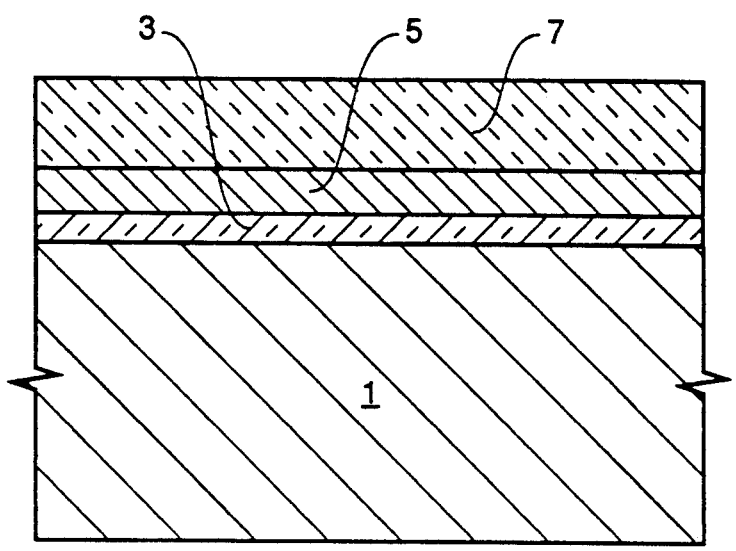
FIGS. 9A and 9B represent the in-process wafer portion of FIGS. 8A and 8B, respectively, following the deposition of a base layer of silicon dioxide.
Figure 9B:
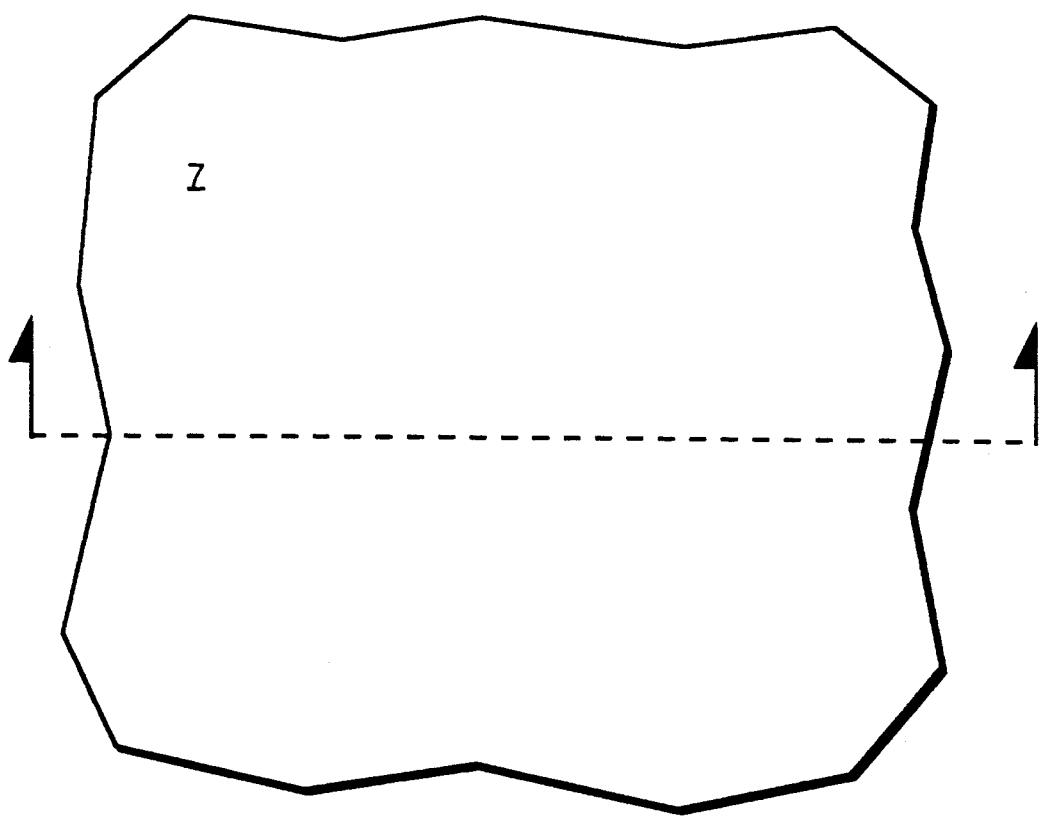
Figure 10A:
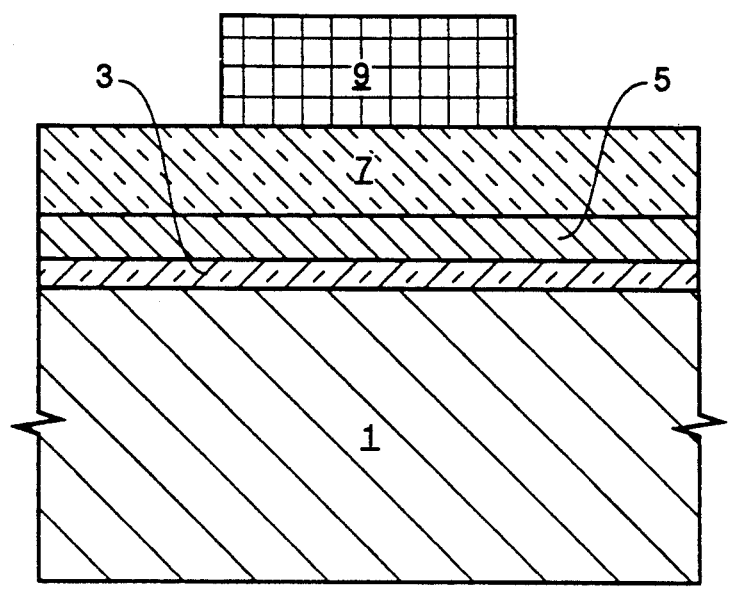
FIGS. 10A and 10B represent the in-process wafer portion of FIGS. 9A and 9B, respectively, following the masking of the base layer of silicon dioxide with photoresist oxide.
Figure 10B:
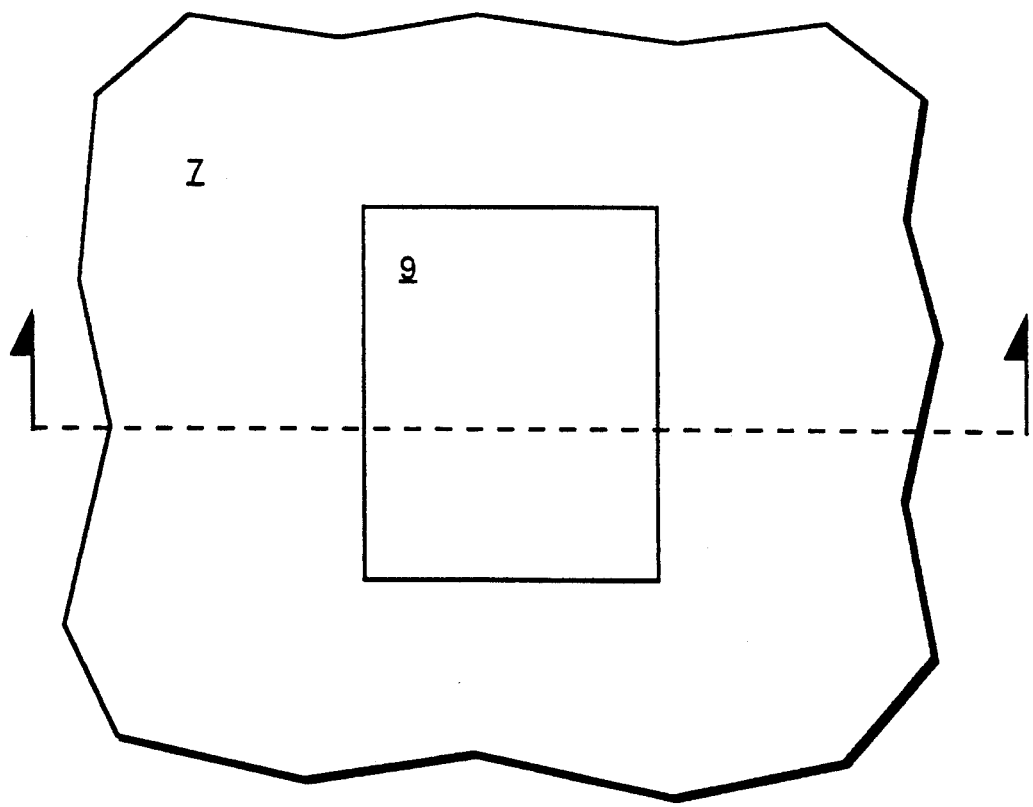

FIGS. 9A and 9B show the initial layerization of the in-process wafer after deposition of a base layer of silicon dioxide 7. The layerization is conventionally masked with a primary photoresist mask 9 shown in FIGS. 10A and 10B.

Figure 11A:
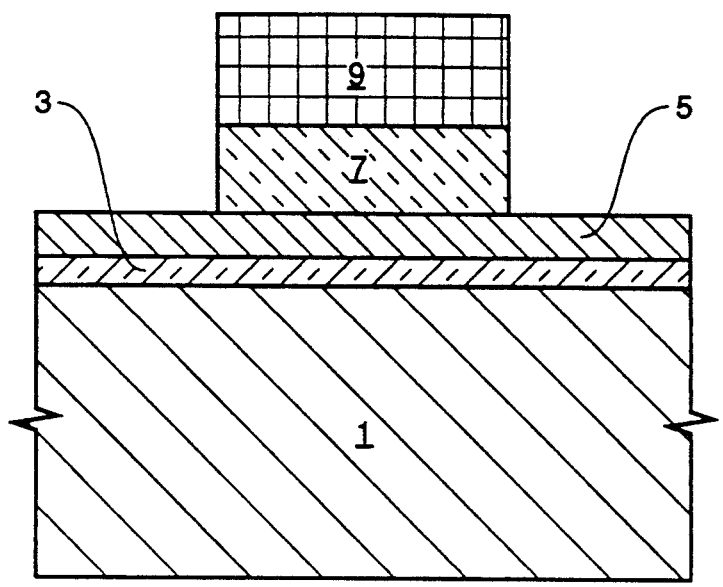
FIGS. 11A and 11B represent the in-process wafer portions of FIGS. 10A and 10B, respectively, following an etch of the base layer of silicon dioxide to form a mask island.
Figure 11B:
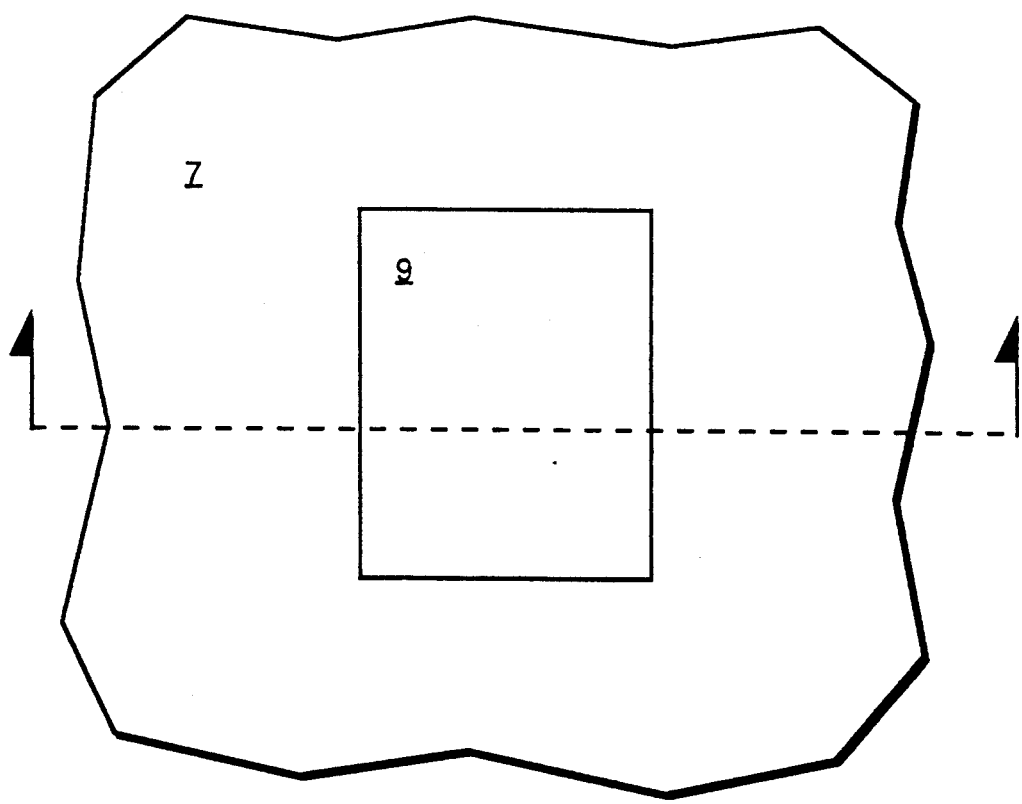

FIGS. 11A and 11B depict the layerization after an anisotropic etch of the base layer of silicon dioxide 7, the optional nitride layer 5 and thin oxide layer 3 remaining intact.

Figure 12A:
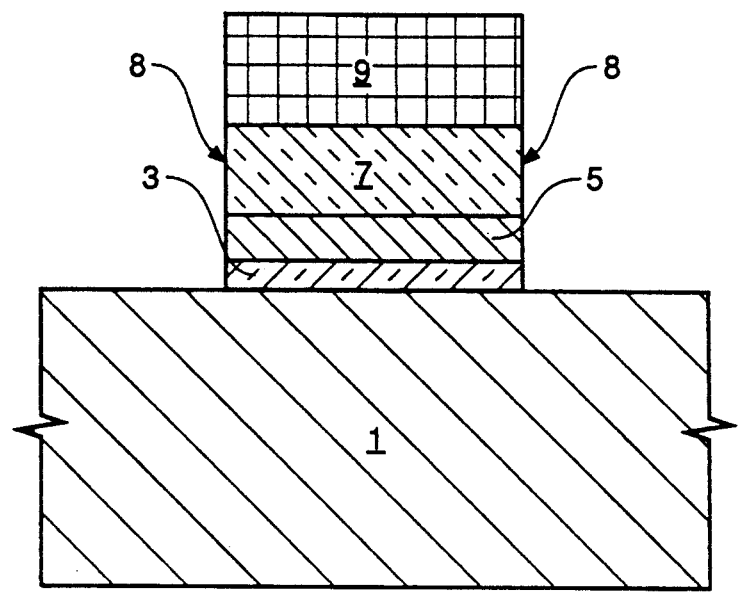
FIGS. 12A and 12B represent the in-process wafer portion of FIGS. 11A and 11B, respectively, following an etch of the nitride layer and the thin oxide layer, said etch completing the formation of the mask island.
Figure 12B:
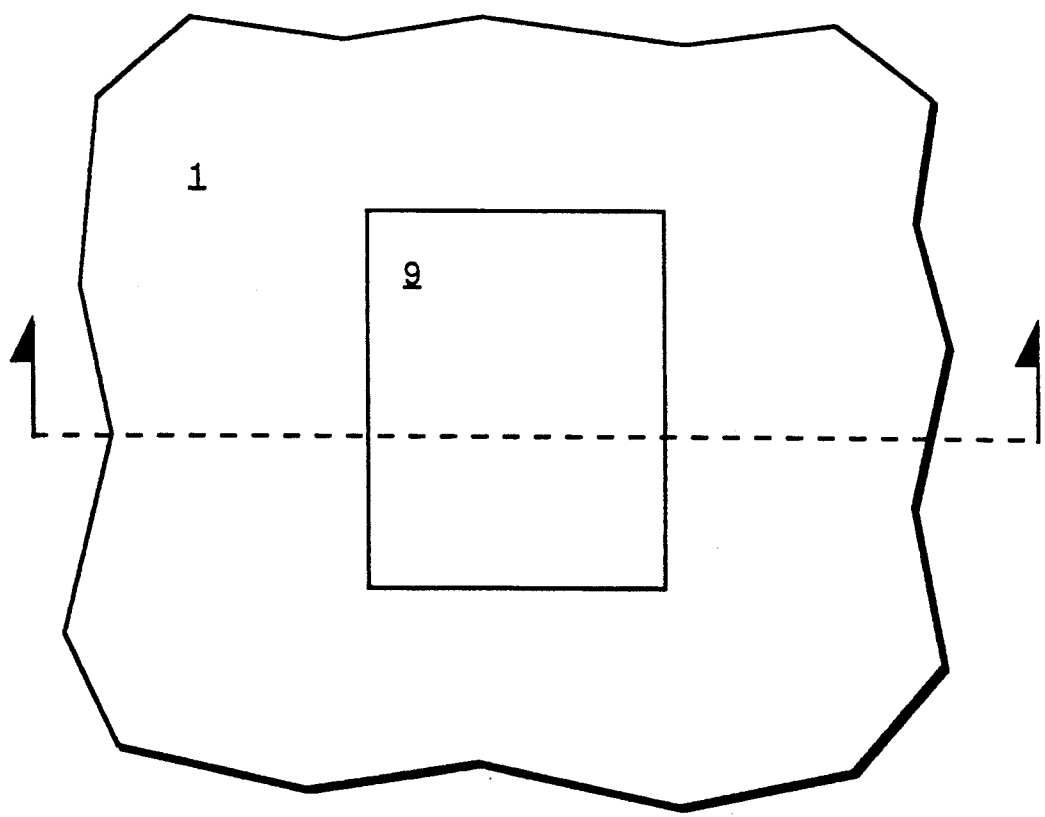

The optional nitride layer 5 is etched to form a layered segment also referred to as mask island 8 and shown in FIGS. 12A and 12B. The vertical layers of the mask island include the thin oxide layer 3, the nitride layer 5 and the silicon dioxide layer 7.

Figure 13A:
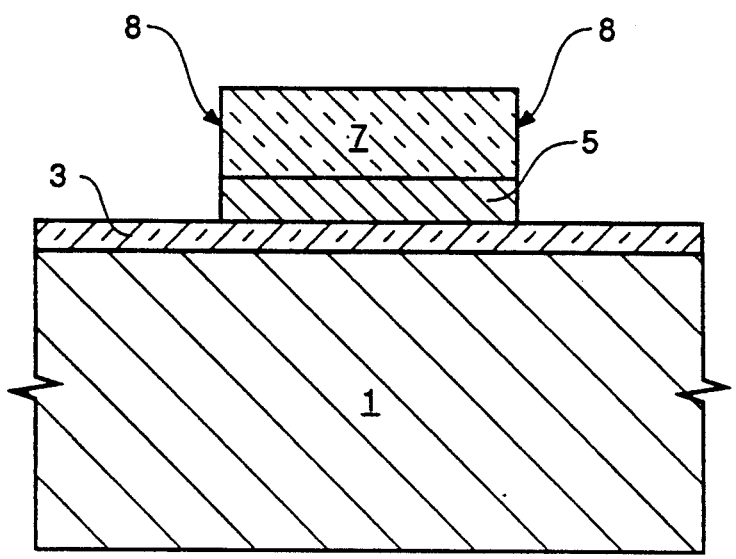
FIGS. 13A and 13B represent the in-process wafer portions of FIGS. 12A and 12B, respectively, following a reoxidation of the substrate and the removal of the photoresist oxide.
Figure 13B:
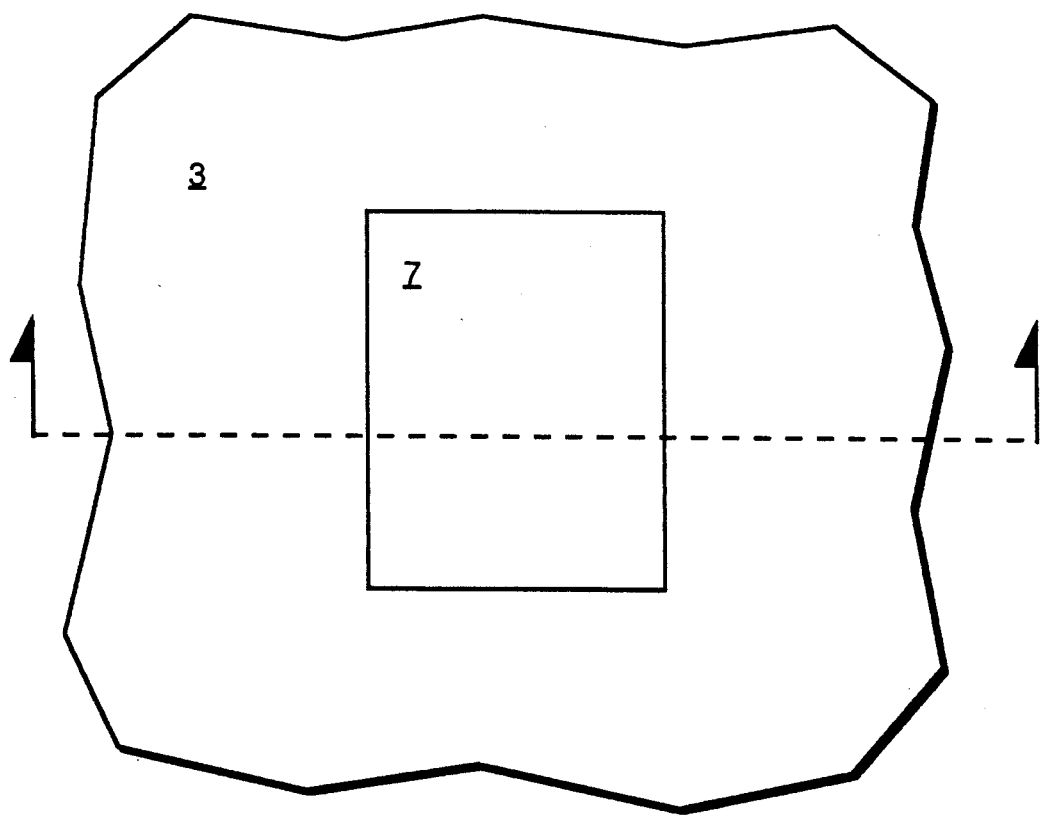

In FIGS. 13A and 13B, the primary photoresist mask 9 shown in FIGS. 12A and 12B is removed and the substrate is subjected to a thermal reoxidation in order to ensure that the thin oxide layer 3 remains intact. FIG. 13B clearly illustrates the region defined by the mask island 8.

Figure 14A:
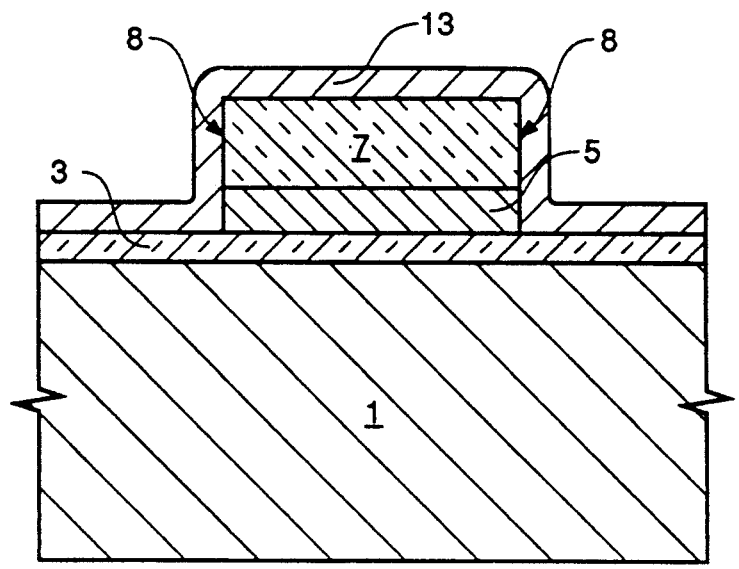
FIGS. 14A and 14B represent the in-process wafer portion of FIGS. 13A and 13B, respectively, following a polycrystalline silicon spacer deposition.
Figure 14B:
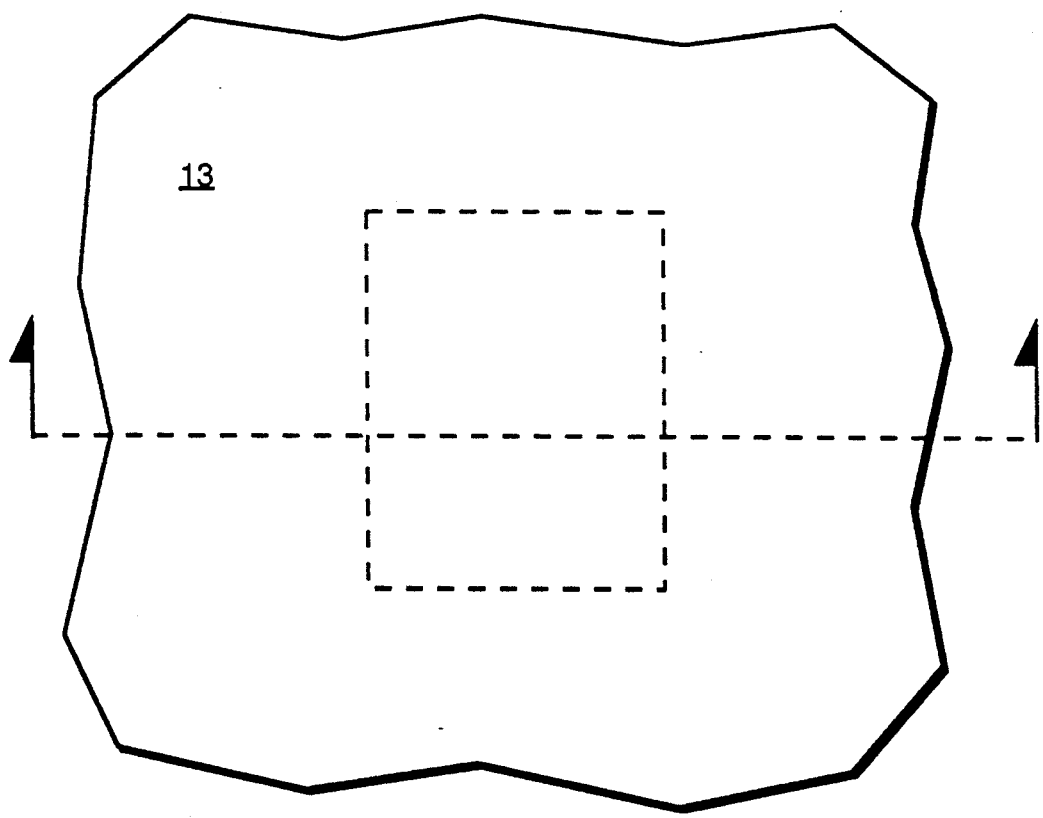

Referring now to FIG. 14A, a conformal expendable polycrystalline silicon spacer layer 13 is blanket deposited by LPCVD on the mask island 8 and thin oxide layer 3. It is important that the thickness of the polycrystalline silicon spacer layer 13 correspond, after deposition, to the desired thickness of the narrow isolated spacings of the trench mask. Thus, the polycrystalline silicon thickness defines the subsequent width of narrow isolated trenches in the substrate, etched according to the trench mask. FIG. 14B depicts the blanket deposition of polycrystalline silicon on the in-process wafer.

Figure 15A:
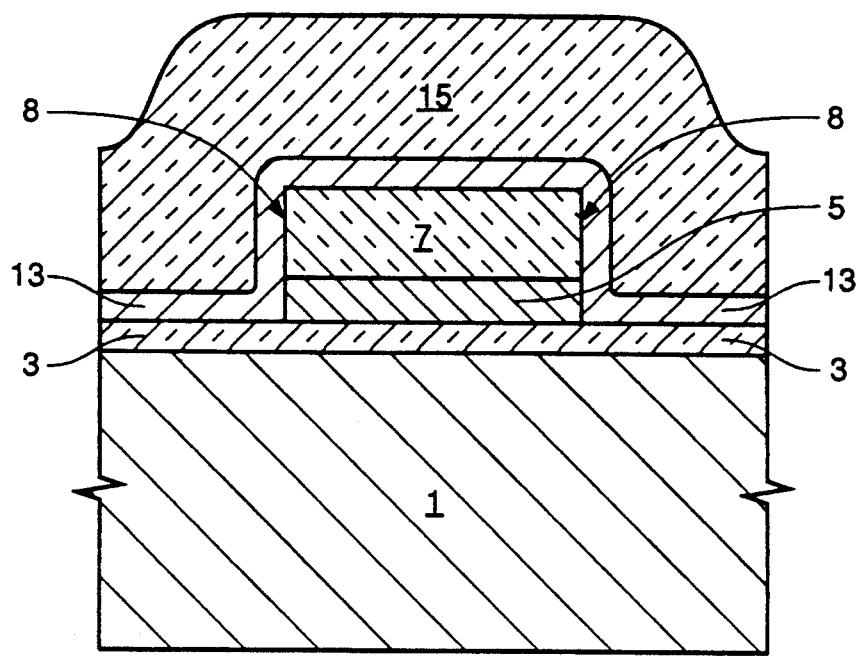
FIGS. 15A and 15B represent the in-process wafer portion of FIGS. 14A and 14B, respectively, following an oxide deposition.
Figure 15B:
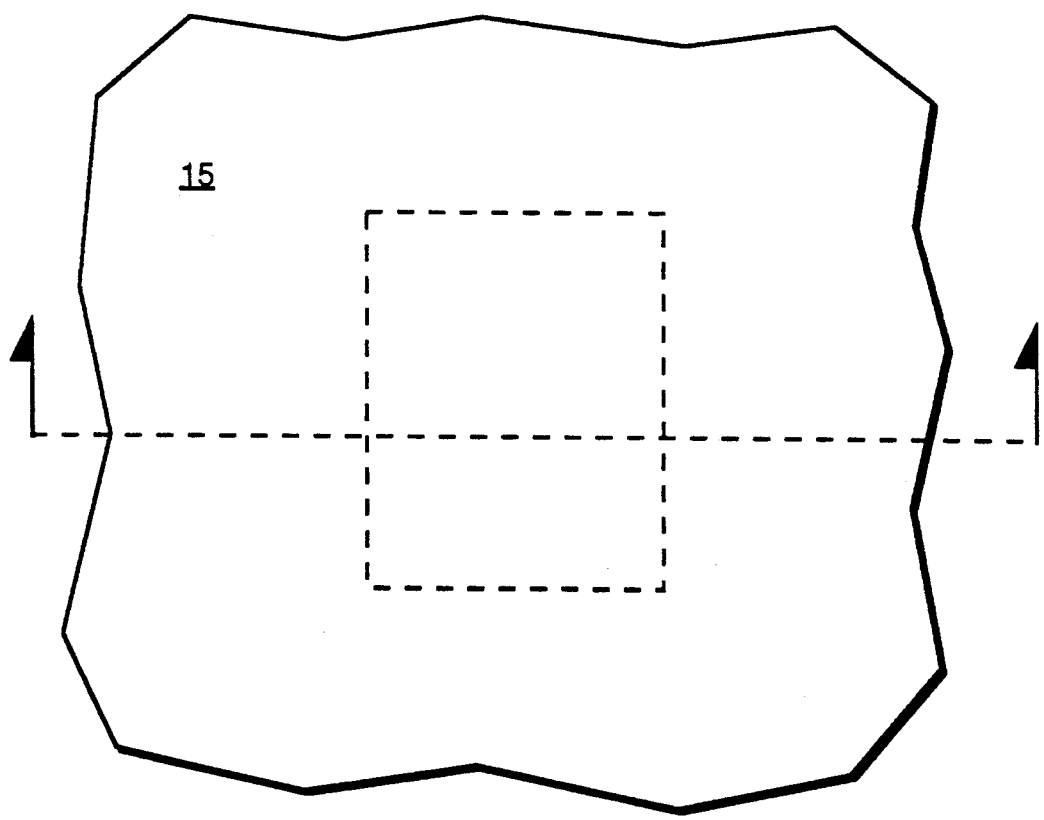

Referring to FIGS. 15A and 15B, a protective oxide layer 13 is blanket deposited on the polycrystalline silicon spacer layer by either LPCVD or by the tetra ethyl ortho silicate (TEOS) process. The polycrystalline silicon 13 having been selected for its high degree of selectivity with respect to its being etchable over the mask island and oxide layer 15.

Figure 16A:
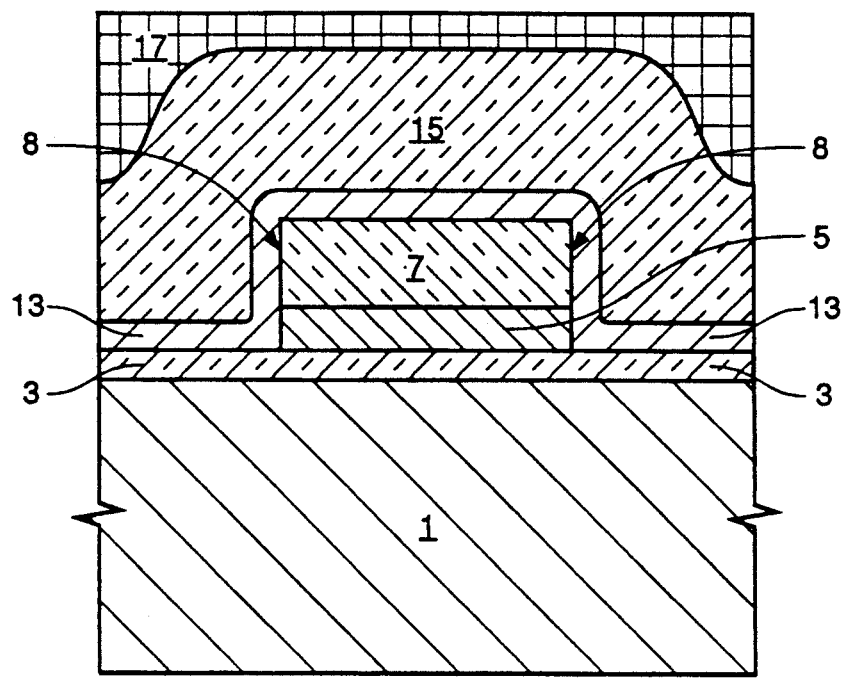
FIGS. 16A and 16B represent the in-process wafer portion of FIGS. 15A and 15B, respectively, following a photoresist application to planarize the wafer.
Figure 16B:
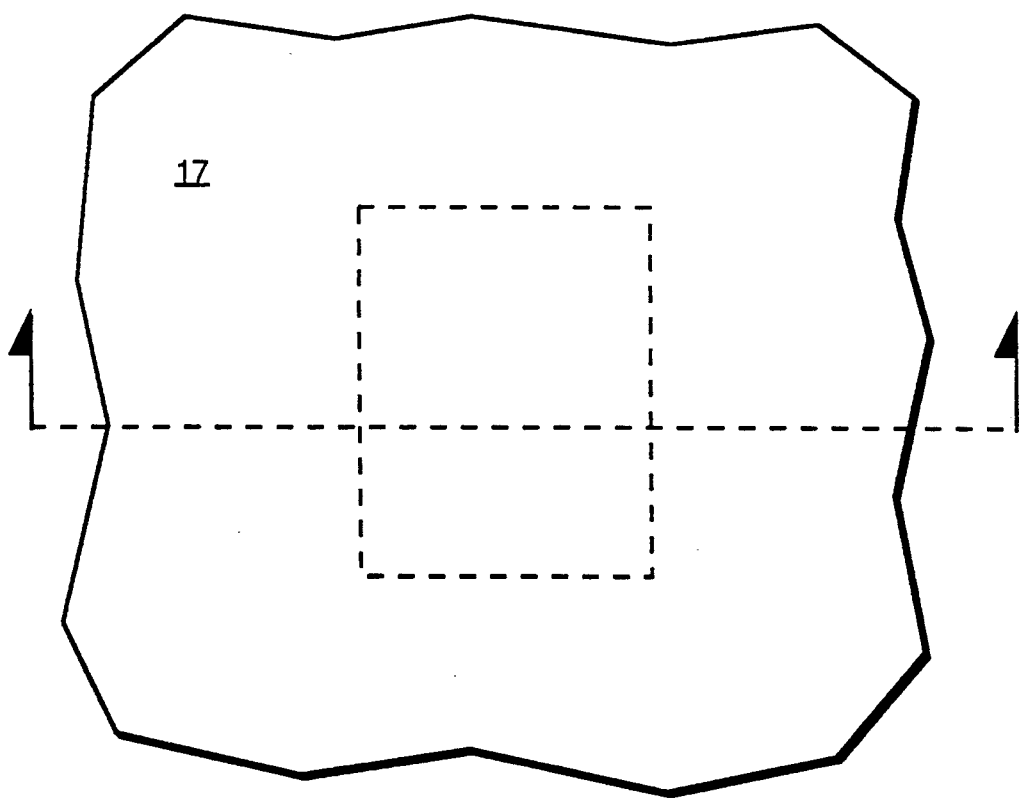

FIGS. 16A and 16B depict the final layerization of the wafer with a planarized layer of photoresist resin 17.

Figure 17A:
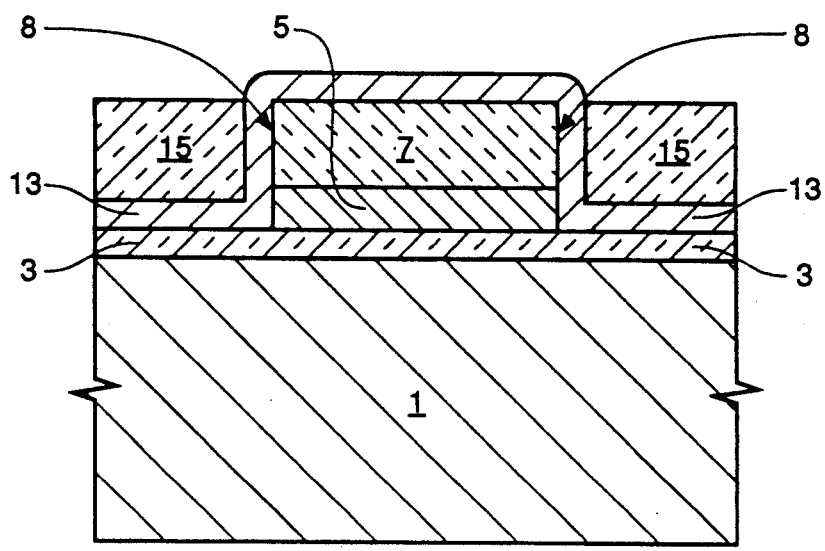
FIGS. 17A and 17B represent the in-process wafer portion of FIGS. 16A and 16B, respectively, following a uniform rate etch of the photoresist and final oxide deposit to expose the spacer deposition adjacent to and overlying the mask island.
Figure 17B:
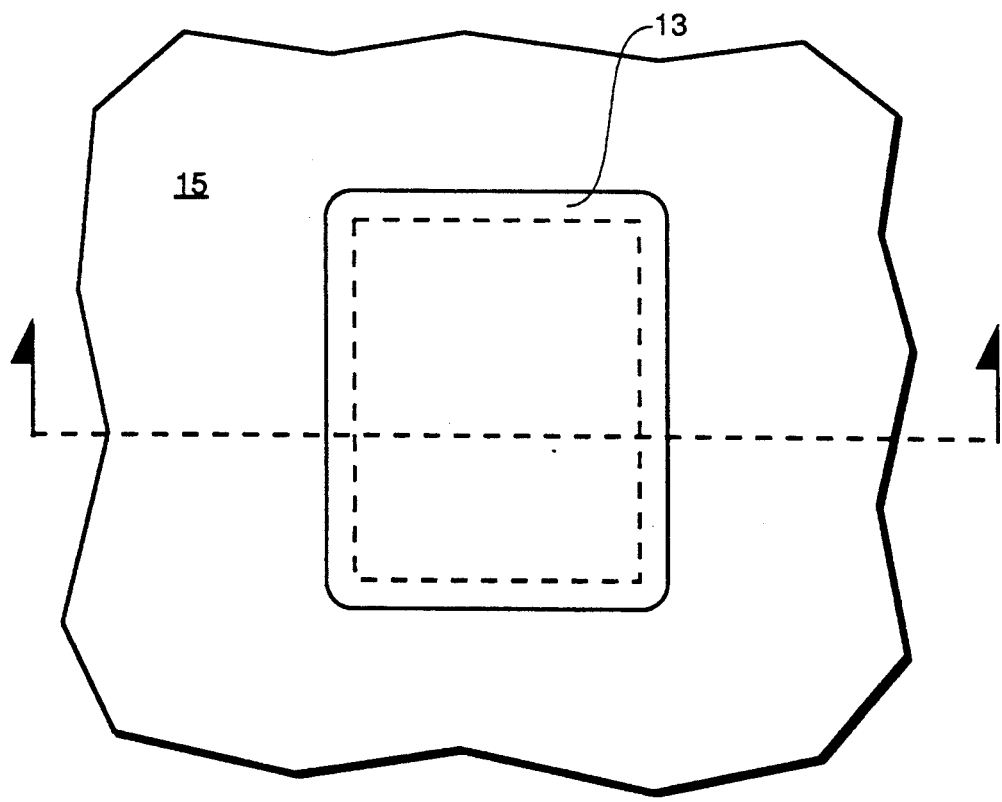

Referring to FIGS. 17A and 17B, the photoresist 17 and the oxide 15 are anisotropically etched with a plasma etch at the same rate to a level being at or below the top of the spacer layer 13 in order to expose the spacer layer 13 above the mask island 8 and vertically adjacent to the island and extending away from the island a distance equal to the thickness of the polycrystalline silicon deposition. The remaining deposition of oxide 15 protects the polycrystalline silicon 13 that was not exposed by the etch. FIG. 17B illustrates the fact that there is now an island of polycrystalline silicon 13 resulting from the etching of the photoresist 17 and oxide 15. Alternately it is possible to eliminate the planarization of the wafer with photoresist and, instead, mechanically etch the oxide layer 15 to a level being at or below the top of the spacer layer 13 in order to expose the polycrystalline silicon spacer layer 13 of FIGS. 17A and 17B. It is also possible to planarize a portion of the polycrystalline silicon spacer 13 layer during the previous mechanical and plasma etches to the same level as the protective oxide layer.

Figure 18A:
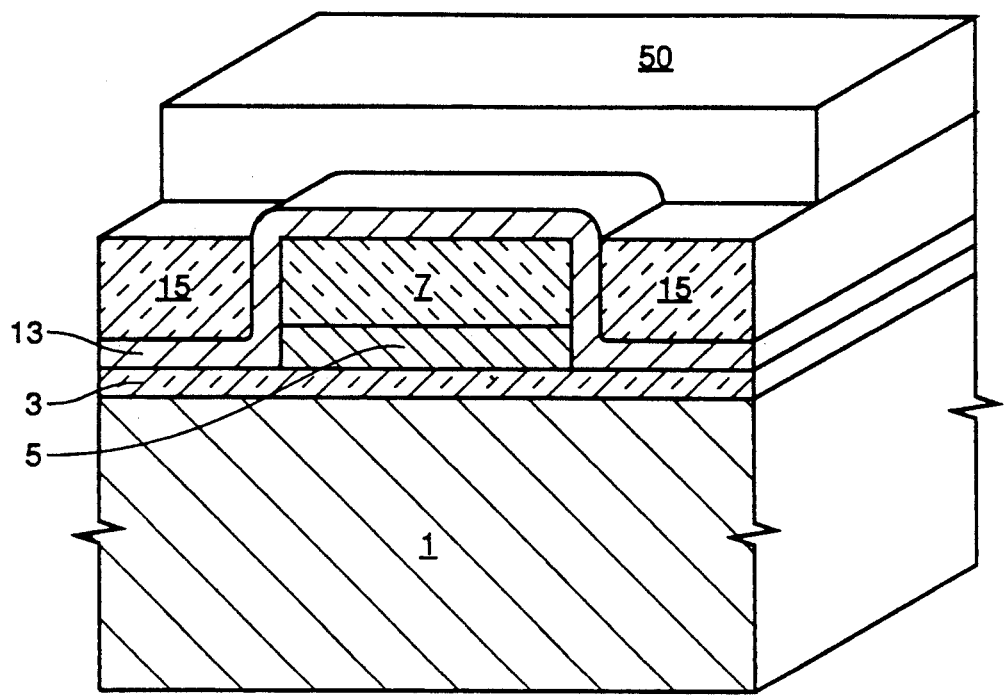
FIGS. 18A and 18B represent the in-process wafer portion of FIGS. 17A and 17B, respectively, following the masking, with an edge mask, of two opposing ends of the spacer layer adjacent to the mask island.
Figure 18B:
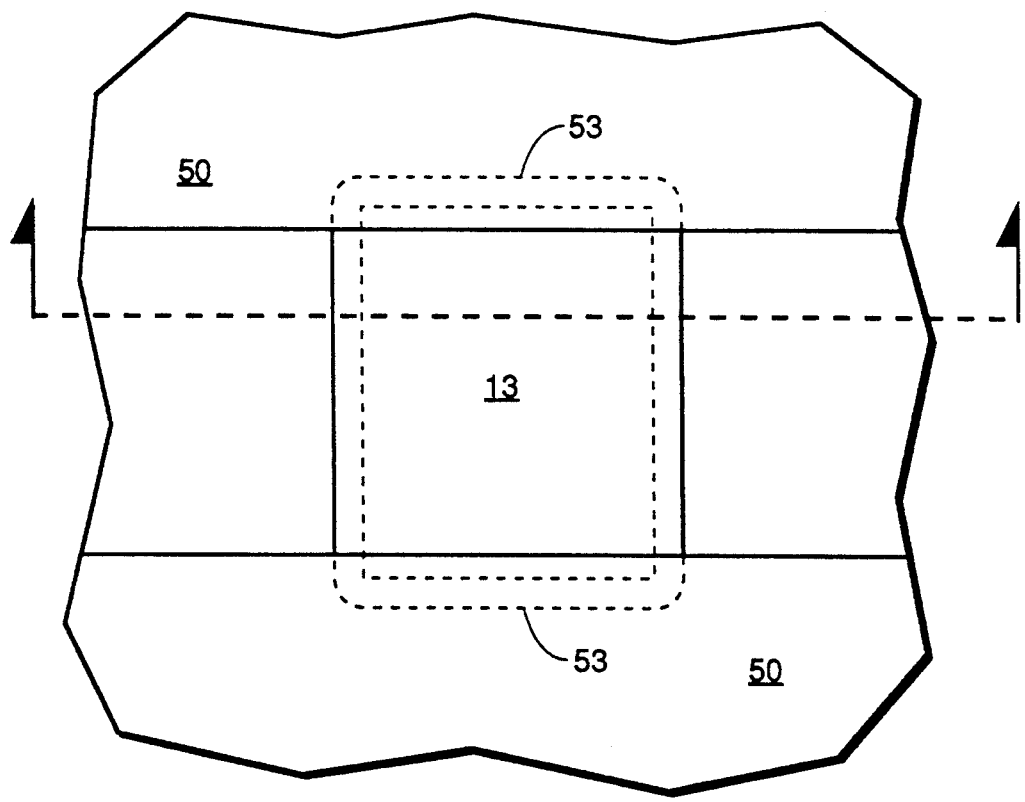

In FIGS. 18A and 18B a photoresist mask 50 is formed to protect two opposing ends 53 of the exposed polycrystalline silicon spacer layer 13 from being etched during subsequent etch steps. More particularly the photoresist mask 50 protects the spacer layer adjacent to the opposing ends of the mask island 8.

Figure 19A:
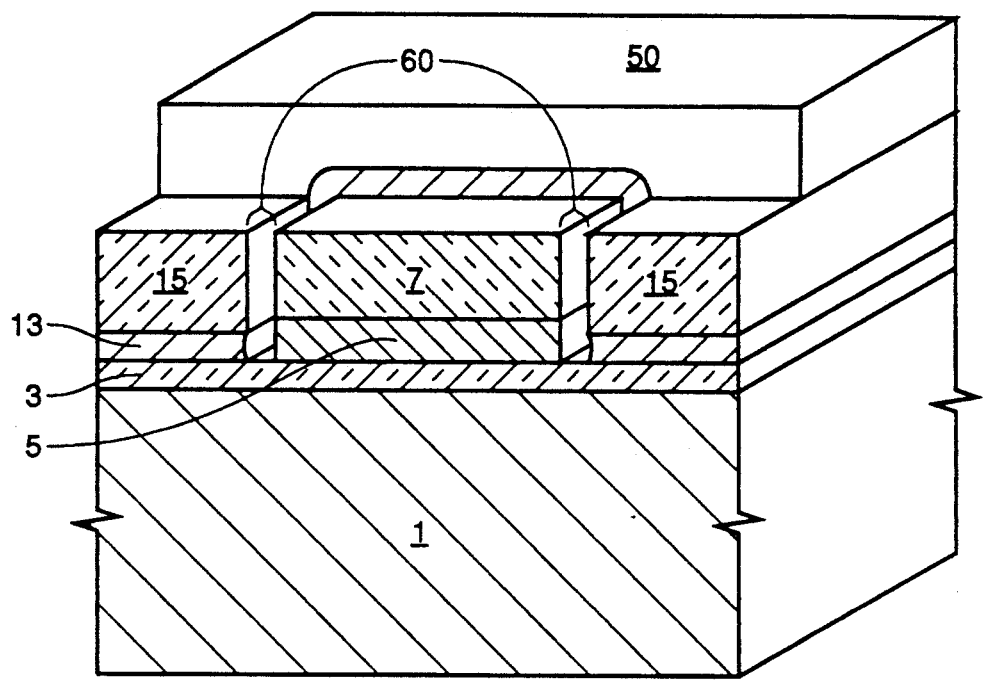
FIGS. 19A and 19B represent the in-process wafer portion of FIGS. 18A and 18B, respectively, following a polycrystalline silicon selective etch.
Figure 19B:
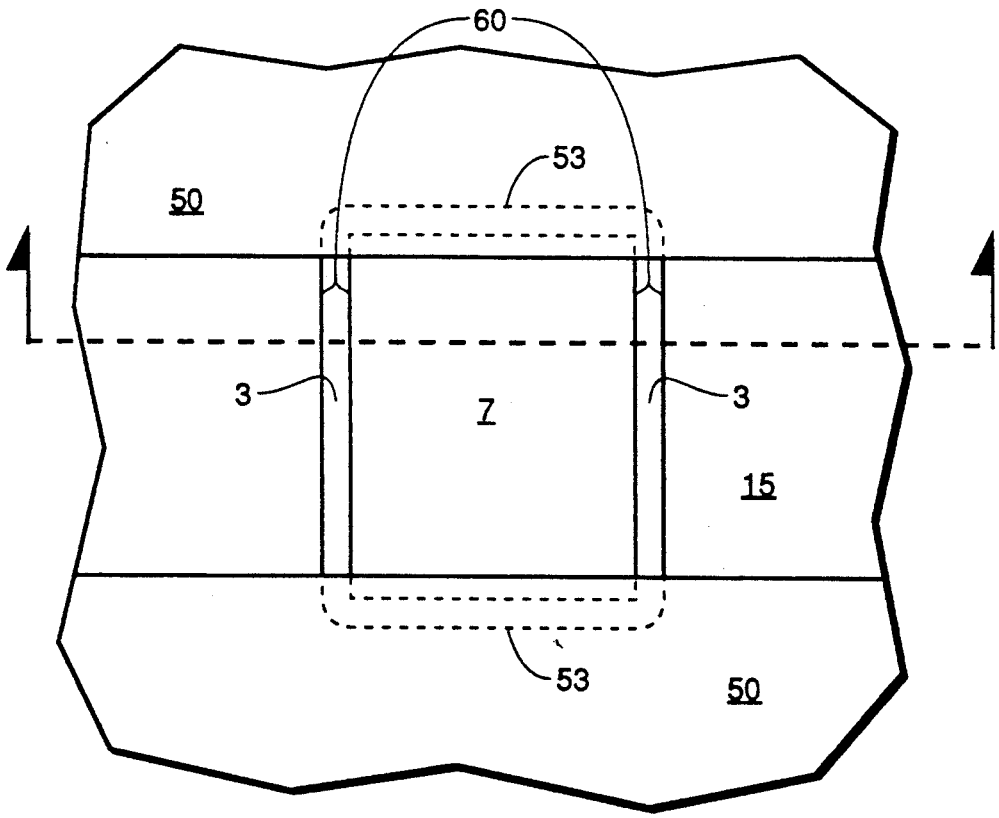

FIGS. 19A and 19B depict the result of isotropically etching the exposed polycrystalline silicon 13 in unmasked areas adjacent to and capping the mask island 8. The polycrystalline silicon 13 protected by the remaining oxide 15 and protected by the photoresist mask 50 is not etched. The result of the polycrystalline silicon etch is two narrow isolated spacings 60, whose sidewalls comprise two opposing sides of the initial mask island 8 and the oxide 15. At this juncture the floor of the narrow isolated spacings 60 consists of the thin oxide layer 3 exposed during the polycrystalline silicon etch. The width of the narrow isolated spacings 60 is equal to the original thickness of the polycrystalline silicon layer 13.

Figure 20A:
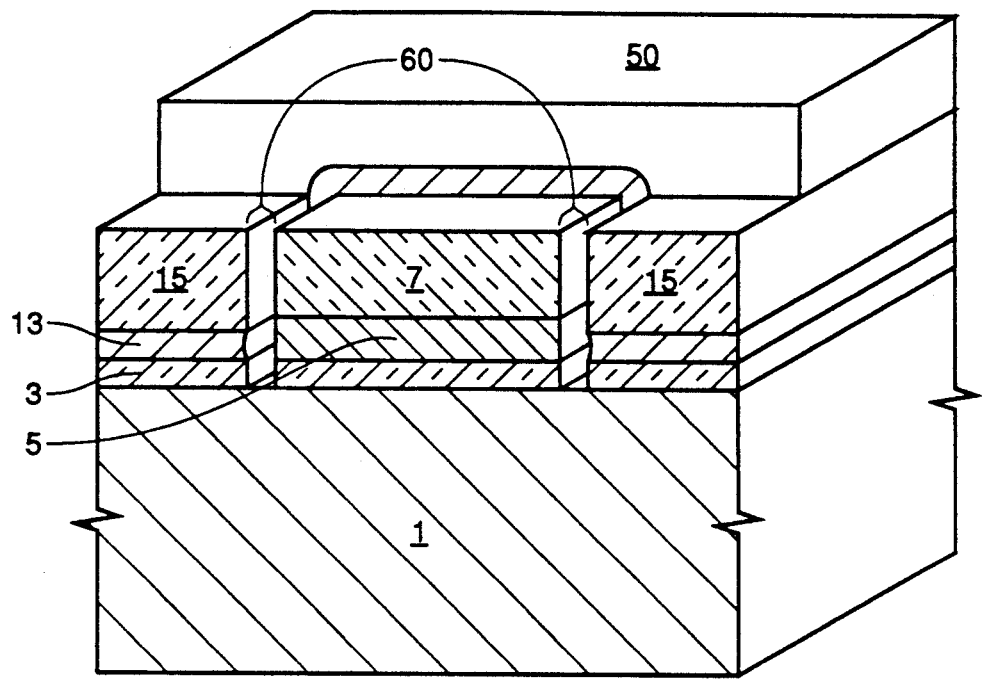
FIGS. 20A and 20B represent the in-process wafer portion of FIGS. 19A and 19B, respectively, following an etch of the thin oxide layer.
Figure 20B:
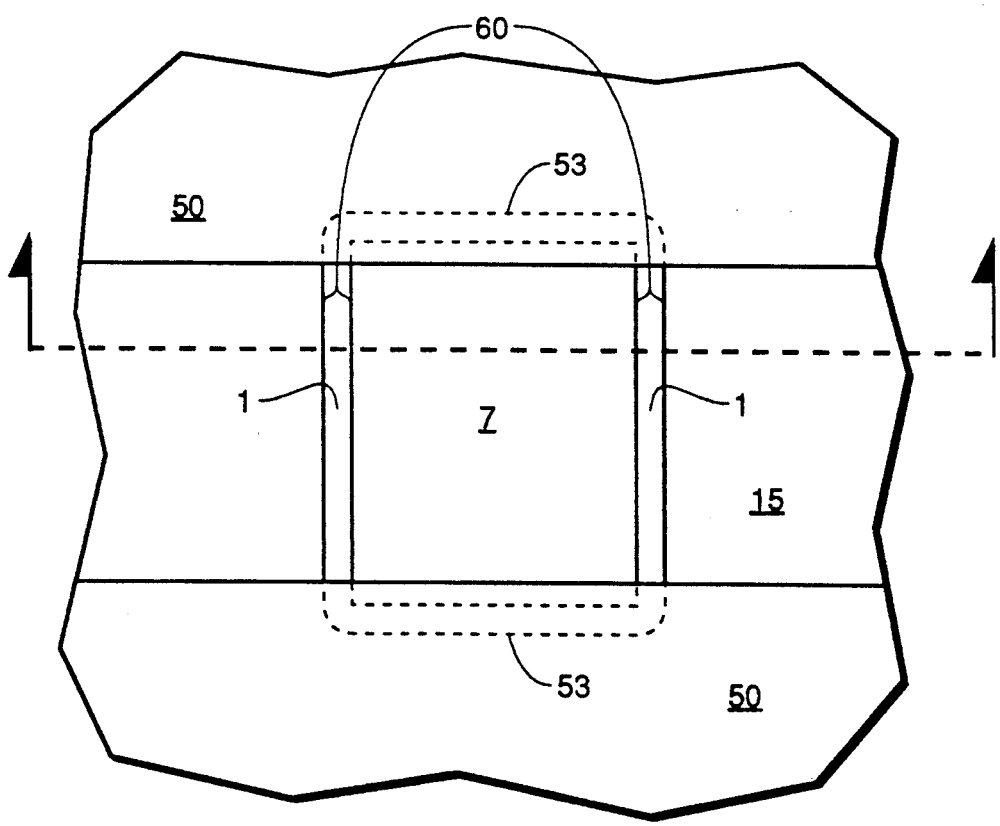

In FIGS. 20A and 20B the thin oxide layer 3 forming the floor of the narrow isolated spacings 60 is now over-etched to expose the substrate 1.

Figure 21A:
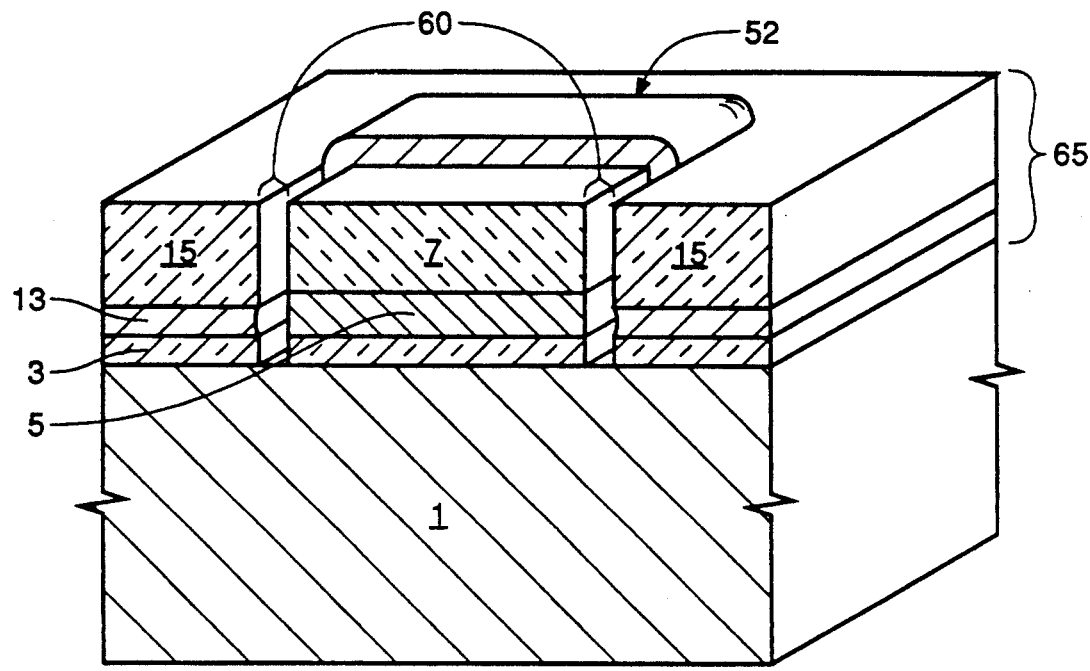
FIGS. 21A and 21B represent the in-process wafer portion of FIGS. 20A and 20B, respectively, following the removal of the trench mask, thus completing the creation of the secondary mask.
Figure 21B:
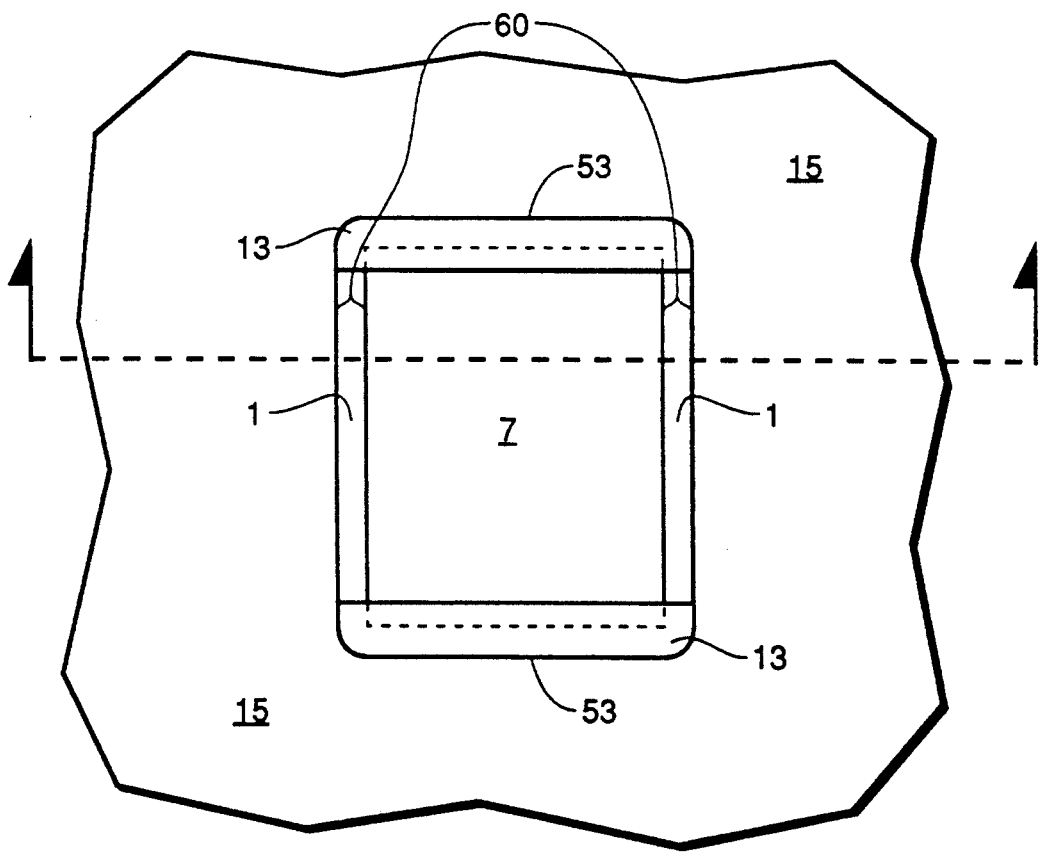

In FIGS. 21A and 21B the photoresist mask 50 shown in FIGS. 20A and 20B is removed and the trench mask fabrication is complete. The trench mask 65 comprises vertical film layer segments of oxide 15, silicon dioxide 7, nitride 5, polycrystalline silicon layer 13, and the thin oxide layer 3. The vertical film layer segments are patterned with narrow isolated spacings 60. The width of the narrow isolated spacings 60 is highly predictable and very narrow, limited only by the limit of the thickness of the polycrystalline silicon layer 13. Subsequent circuitry may be fabricated according to the pattern defined by the trench mask 65. A further aspect of the invention comprises formation of narrow isolated trenches in the substrate etched according to the trench mask 65 and described below.

Figure 22A:
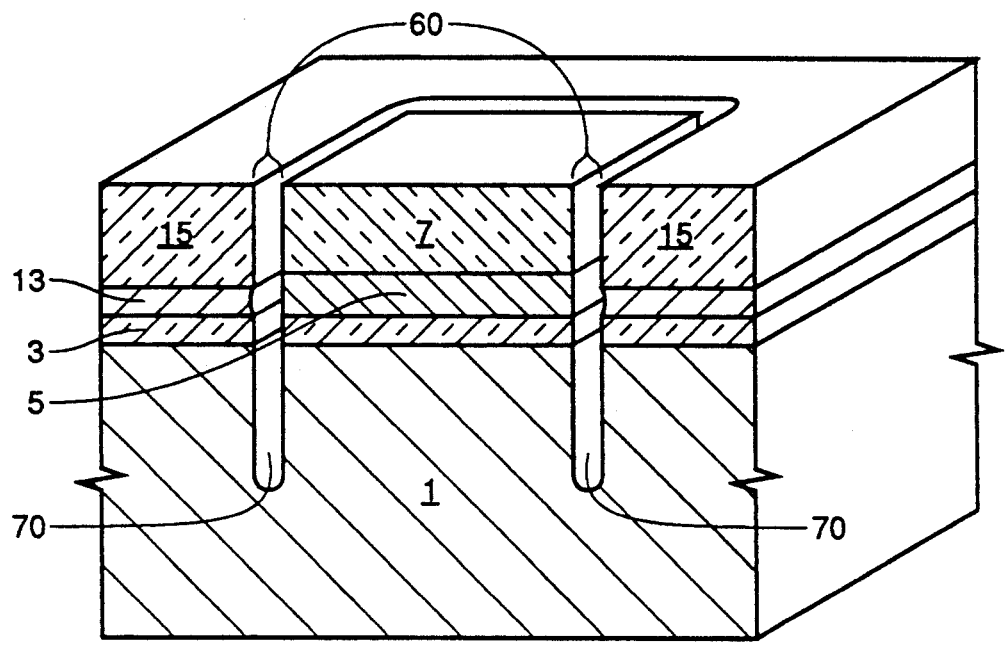
FIG. 22A and 22B represent the in-process wafer portion of FIGS. 21A and 21B, respectively, following an etch to form trenches in the substrate and trenches adjacent to opposing ends of the mask island.
Figure 22B:
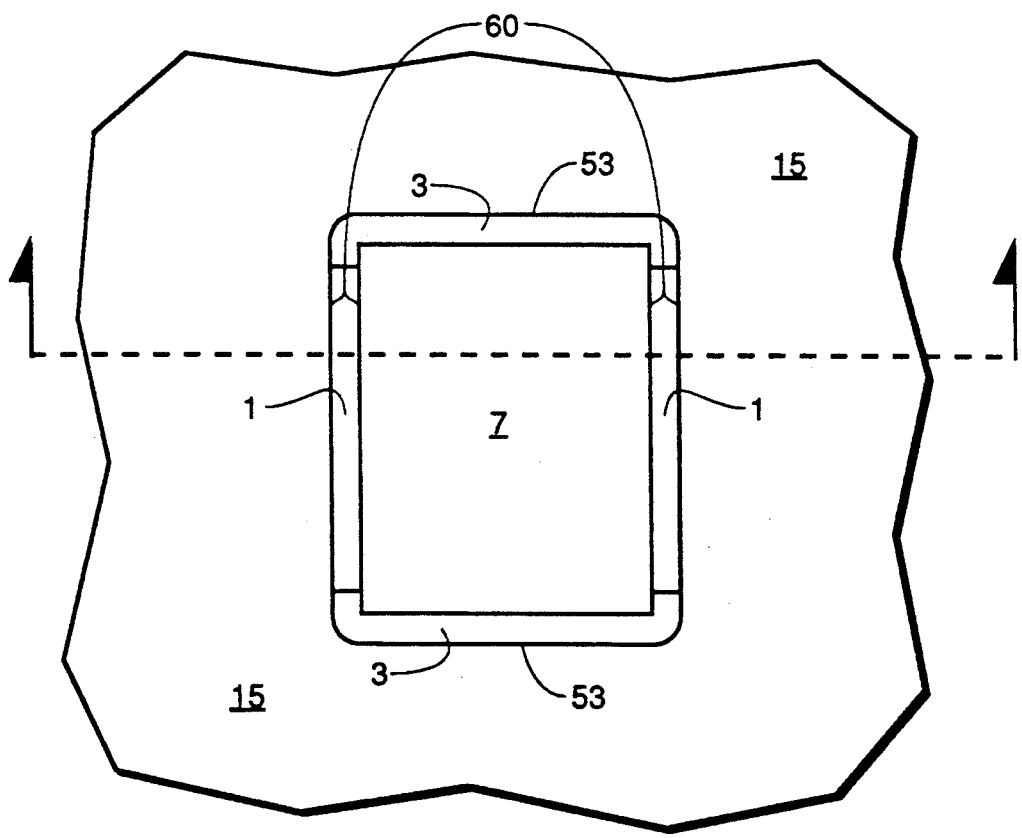

In FIGS. 22A and 22B the narrow isolated trenches 70 are etched in the exposed substrate 1 using an anisotropic process that is highly selective for silicon. The width of the narrow isolated trenches 70 is defined by the width of the narrow isolated spacings 60 of the trench mask 65 and are therefore equal in width to the depth of the polycrystalline silicon layer 13. Thus the width of narrow isolated trenches is only limited by the deposition limits of the polycrystalline silicon layer 13. The substrate 1 and polycrystalline silicon layer 13 at the opposing ends 53 are etched at nearly the same rate and the etch is terminated before the entire thin oxide layer 3 is removed in the opposing ends 53. Thus the depth of the narrow isolated trenches 70 may at least be equal to the vertical height measured from the top surface of the thin oxide layer 3 to the top surface 52 of the initially deposited polycrystalline silicon layer 13 as shown in FIG. 21A, in the case where none of the thin oxide layer 3 in the opposing ends 53 is etched. Typically more of the substrate 1 will be consumed by the etch than the oxide 3 consumed by the etch, thereby increasing the depth of the narrow isolated trenches when portions of the oxide 3 are etched.

Figure 23A:
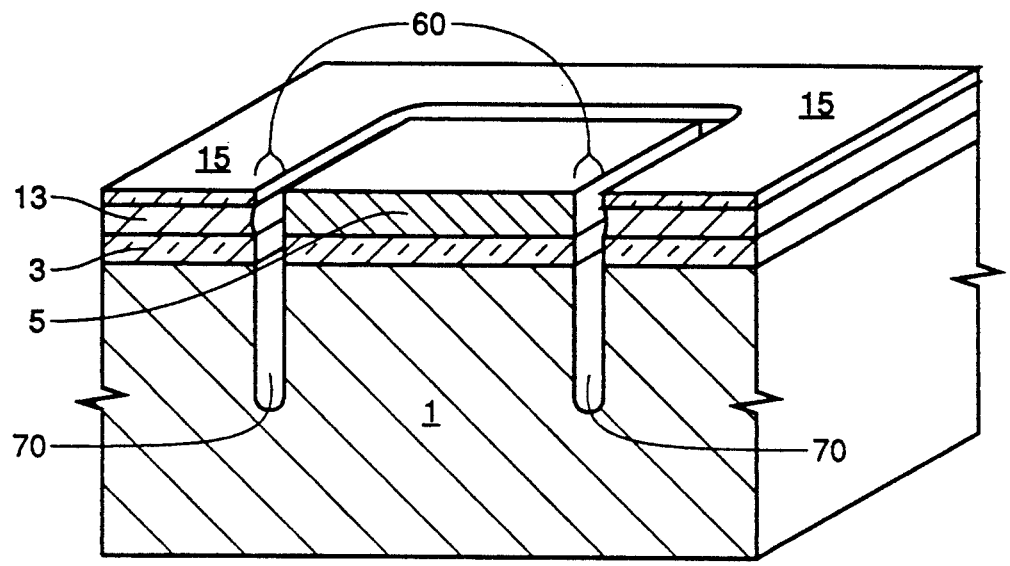
FIGS. 23A and 23B represent the in-process wafer portion of FIGS. 22A and 22B, respectively, following a chemical mechanical planarization (CMP) of the oxide layer and silicon dioxide layers.
Figure 23B:
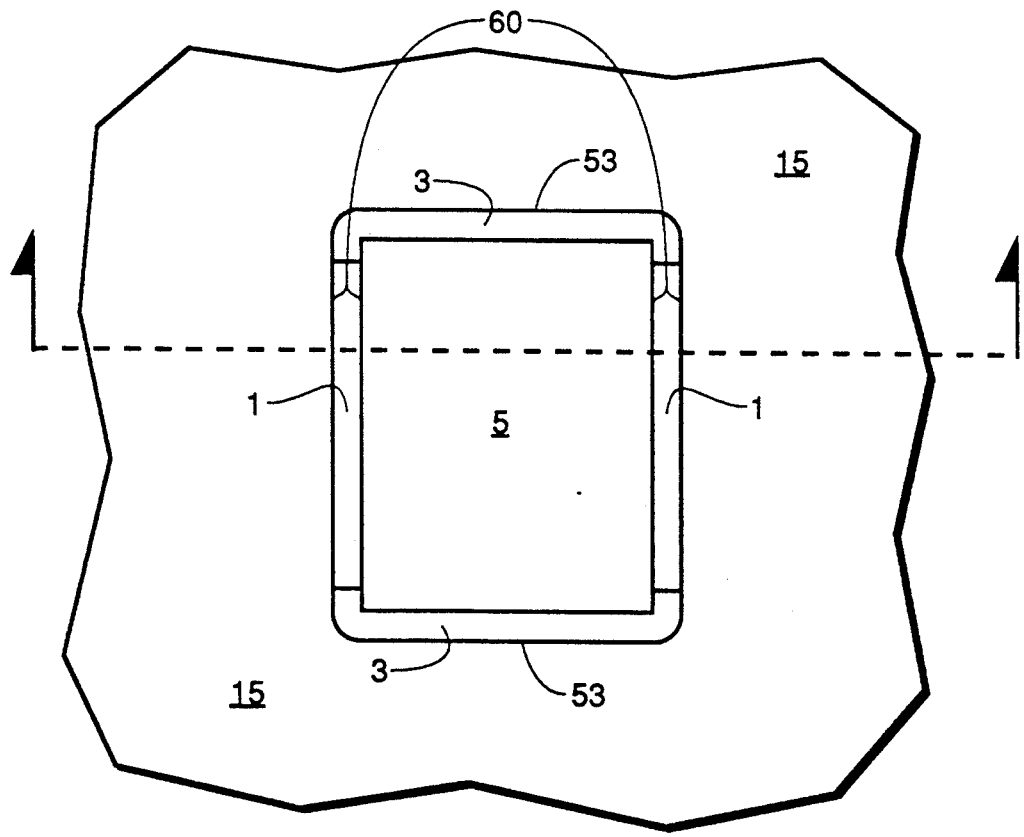

In FIGS. 23A and 23B the oxide layer 15 and the silicon dioxide layer 7 are chemically mechanically planarized (CMP) to expose the nitride layer 5. However, some designers may wish to eliminate this step incorporating this planarization with the planarization of the subsequent oxide deposit.

Figure 24A:
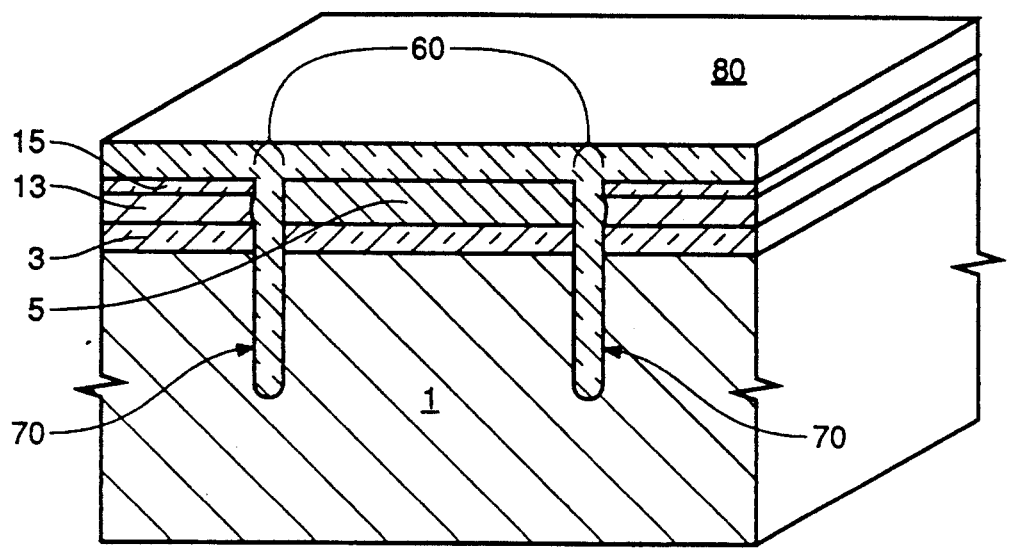
FIGS. 24A and 24B represent the in-process wafer portion of FIGS. 23A and 23B, respectively, following an oxide deposition to fill the trenches.
Figure 24B:
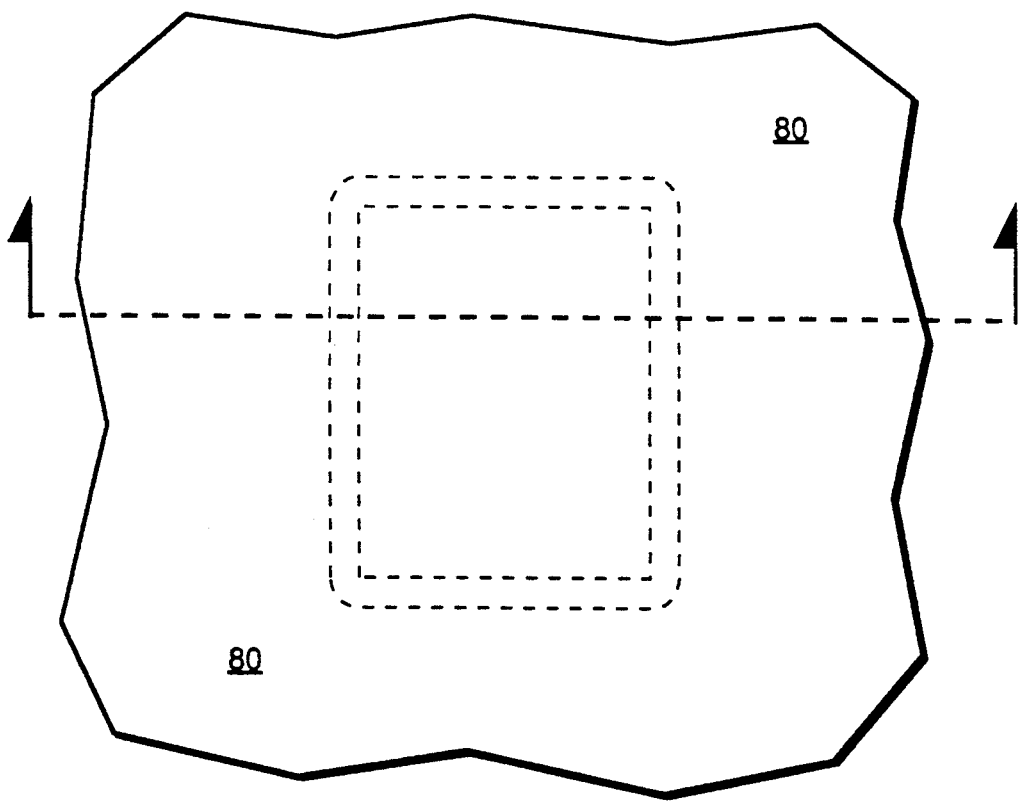

In FIGS. 24A and 24B oxide 80 is deposited to fill the narrow isolated trenches 70 and the narrow isolated spacings 60 and to overlie the oxide 13 and nitride 5. Optionally the oxide 80 may be thermally grown in a diffusion oven from each sidewall of the trenches. This oxide growth is possible because the trenches are so narrow. A $0.2\mu$ trench will consume only $0.1\mu$ of silicon. This is equal to the radius of the trench and will therefore fill it. In either case, minimal oxide is needed because of the narrowness of the trenches.

Figure 25A:
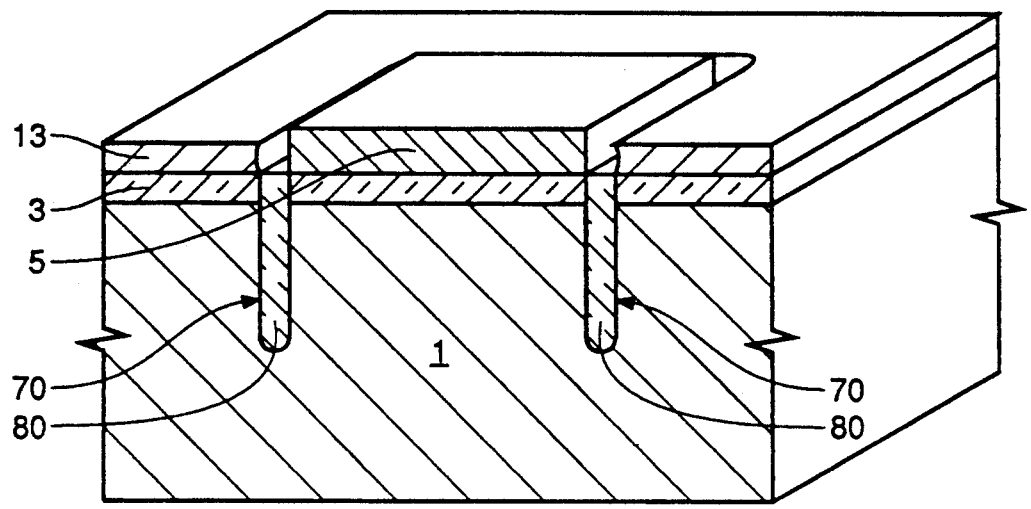
FIGS. 25A and 25B represent the in-process wafer portion of FIGS. 24A and 24B, respectively, following the removal of the oxide deposition overlying the spacer deposition and nitride.
Figure 25B:
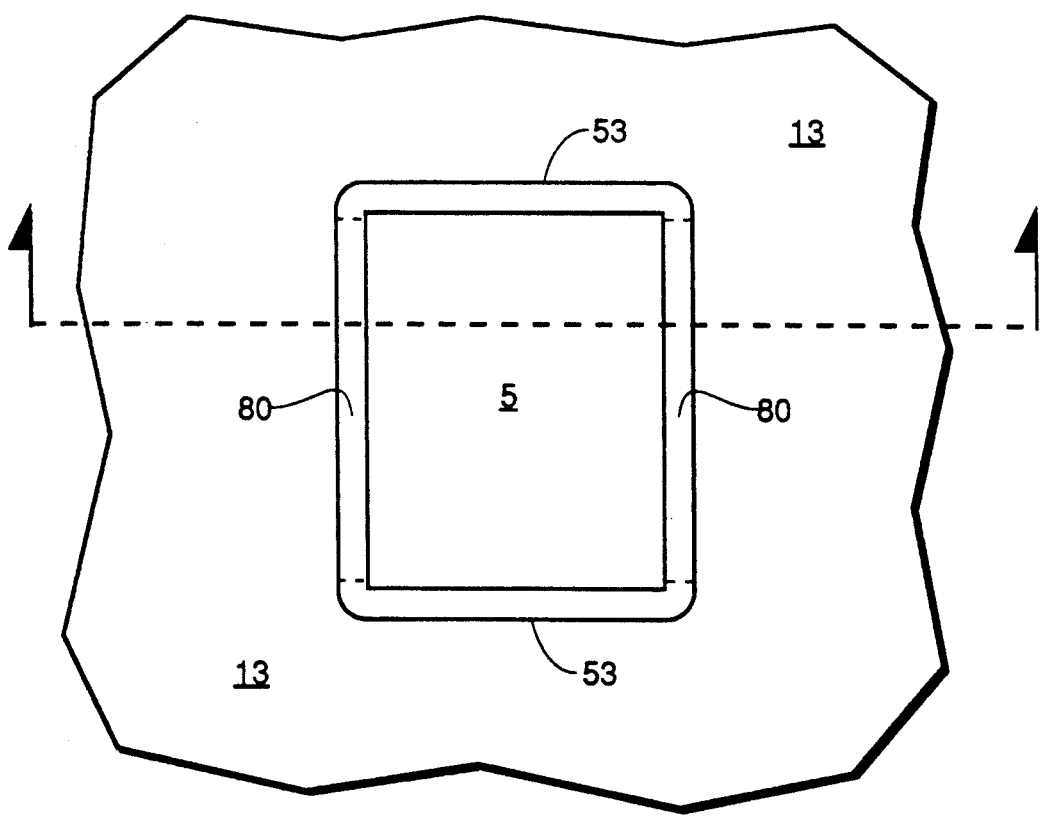

In FIGS. 25A and 25B the oxide 80 is chemically mechanically planarized and then dipped off retaining oxide in the narrow isolated trenches 70 and in cavities interposed in the thin oxide layers 3. The height of the oxide 80 being limited to the upper surface of the oxide layers 3.

Figure 26A:
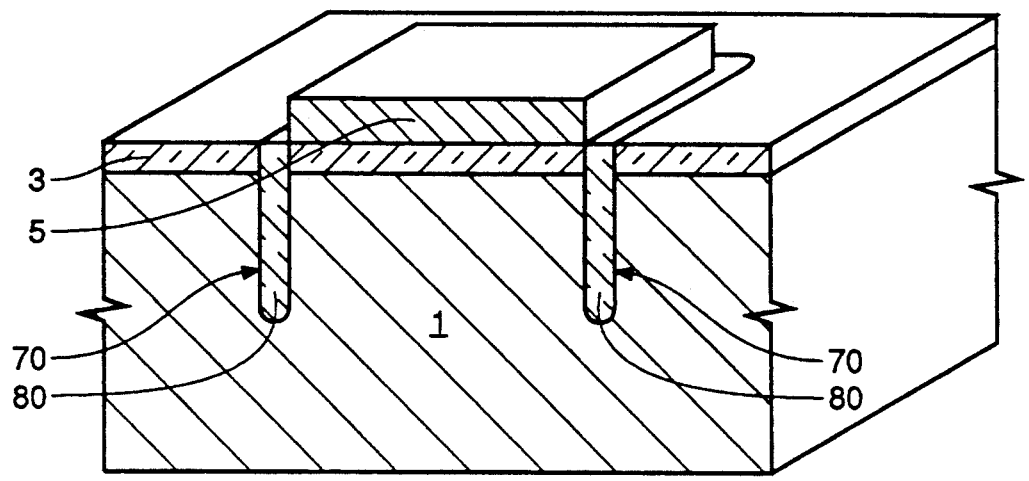
FIGS. 26A and 26B represent the in-process wafer portion of FIGS. 25A and 25B, respectively, following a final etch of the spacer deposition.
Figure 26B:
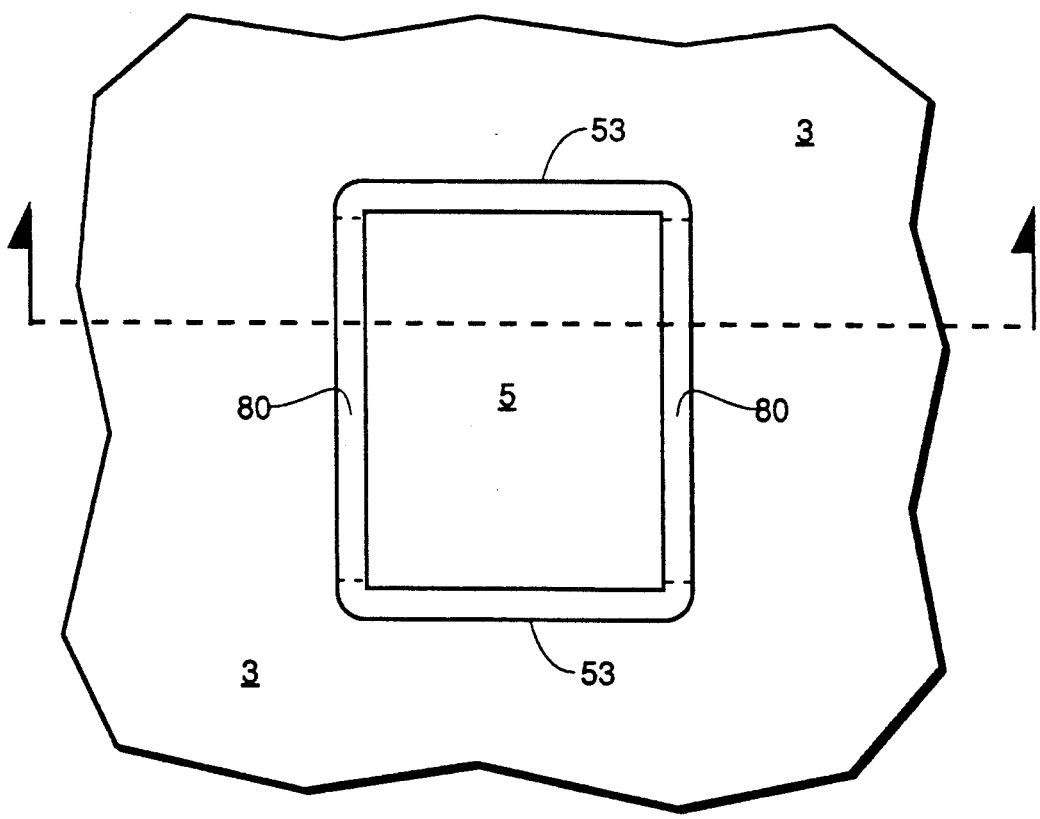

In FIGS. 26A and 26B the polycrystalline silicon layer 13 shown in FIGS. 25A and 25B is etched leaving the nitride layer 5 and the thin oxide layer 3.

Figure 27A:
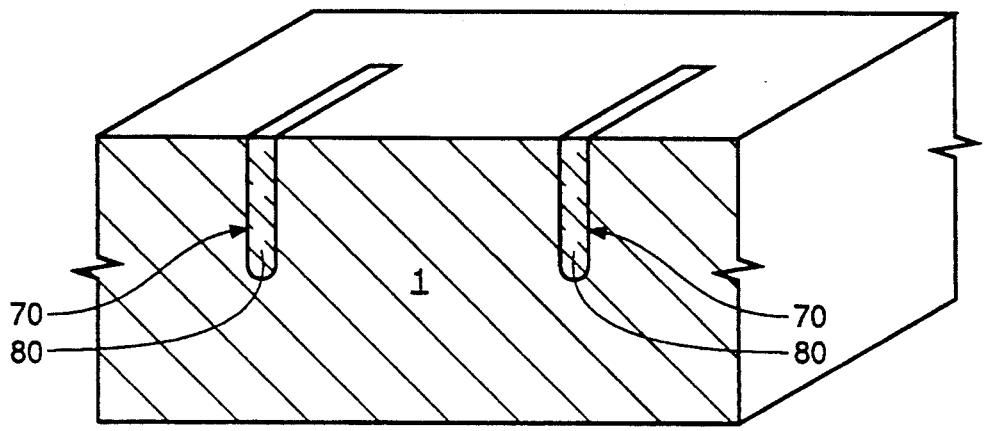
FIGS. 27A and 27B depict the secondary mask defining 4 narrow isolated spacings.
Figure 27B:
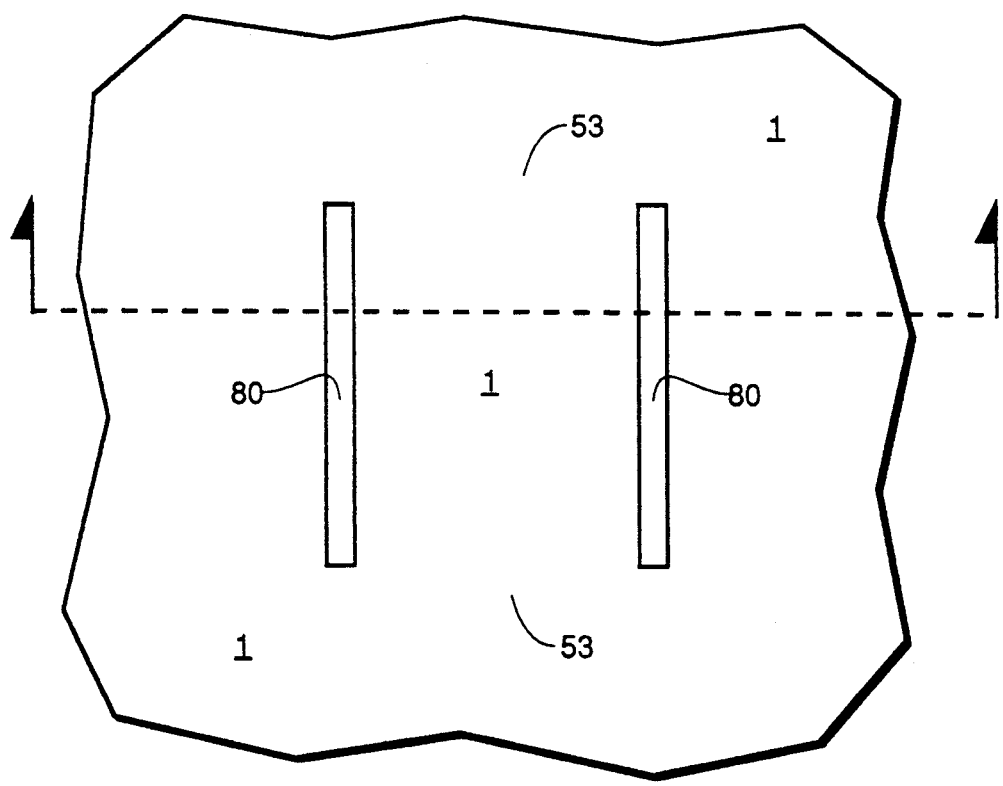

In FIGS. 27A and 27B the process has been completed by etching first the nitride layer 5 and then chemically mechanically planarizing the thin oxide layer 3 shown in FIGS. 26A and 26B. Thus the application utilizing the trench mask 65 of FIGS. 21A and 21B to create narrow isolated trenches 70 filled with oxide 80 is complete. The oxidized trenches fabricated with the trench mask 65 have a narrow width exactly equal to the thickness of the polycrystalline silicon deposition spacer layer 13, thus facilitating even denser circuit fabrication. The method of forming trenches in this embodiment results in the exact placement and a predictable width of the isolation trenches. These facts, coupled with the minimum masking steps this method entails, creates a significant advance in the fabrication of isolated trenches.

Figure 28A:
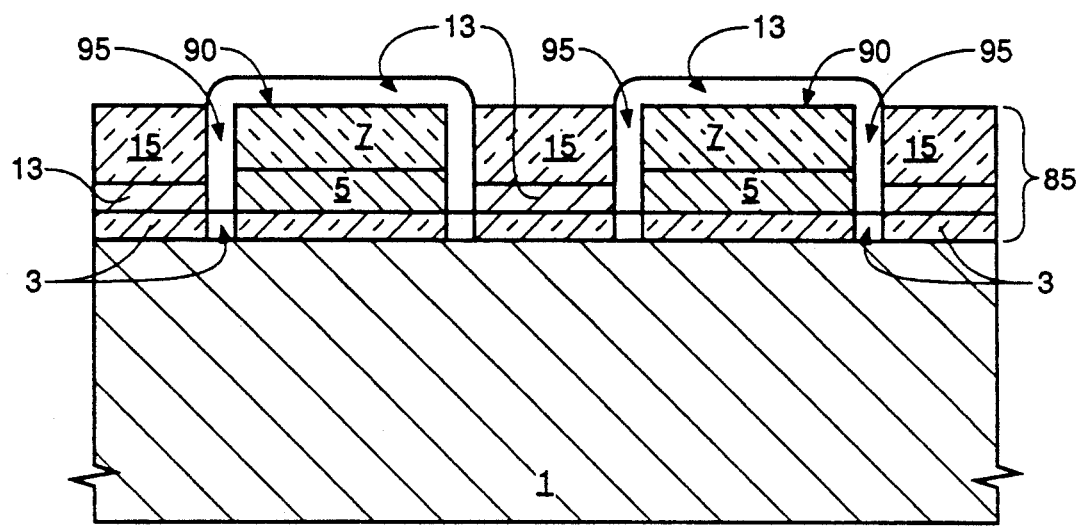
FIGS. 28A and 28B represent the in-process wafer portion of FIGS. 27A and 27B, depicting the 4 narrow isolated trenches formed according to the secondary mask of FIGS. 27A and 27B and filled with oxide.
Figure 28B:
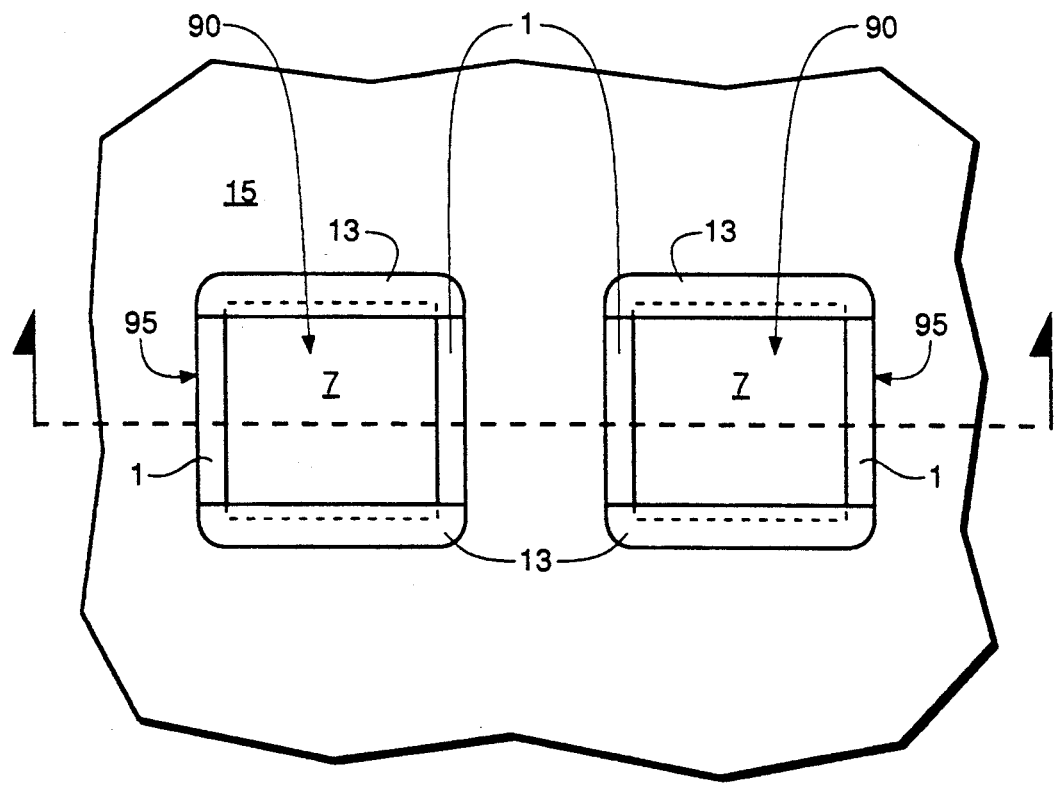

FIGS. 28A and 28B are a representation of the trench mask 85 of the invention wherein more than one mask island 90 is utilized to fabricate more than two narrow isolated spacings 95 in the trench mask 85. Said representation is indicative of the fabrication of any plurality of narrow isolated spacings in a trench mask, wherein the number of narrow isolated spacings is equal to twice the number of mask islands.

Figure 29A:
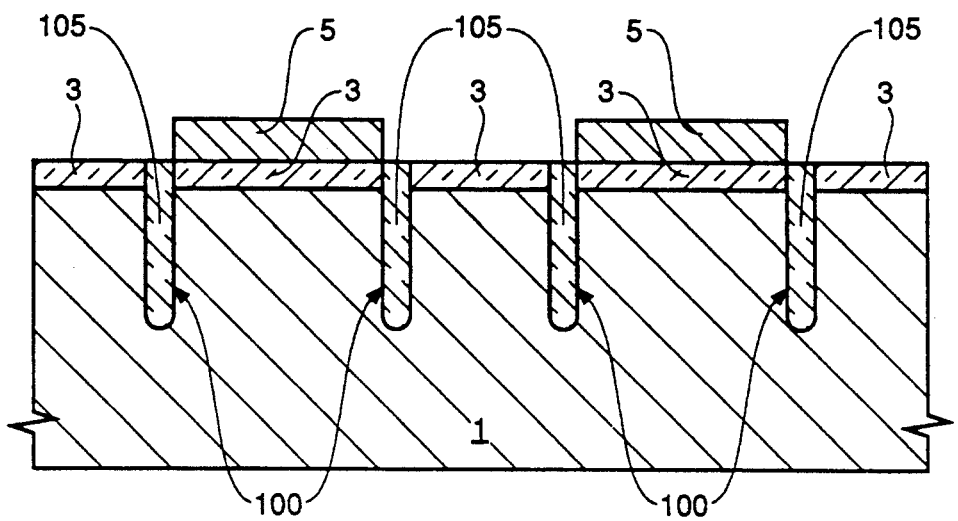
FIGS. 29A and 29B depict narrow isolated trenches 100 fabricated according to the trench mask 85 as shown in FIGS. 28A and 28B. The narrow isolated trenches 100 have been filled with oxide 105.
Figure 29B:
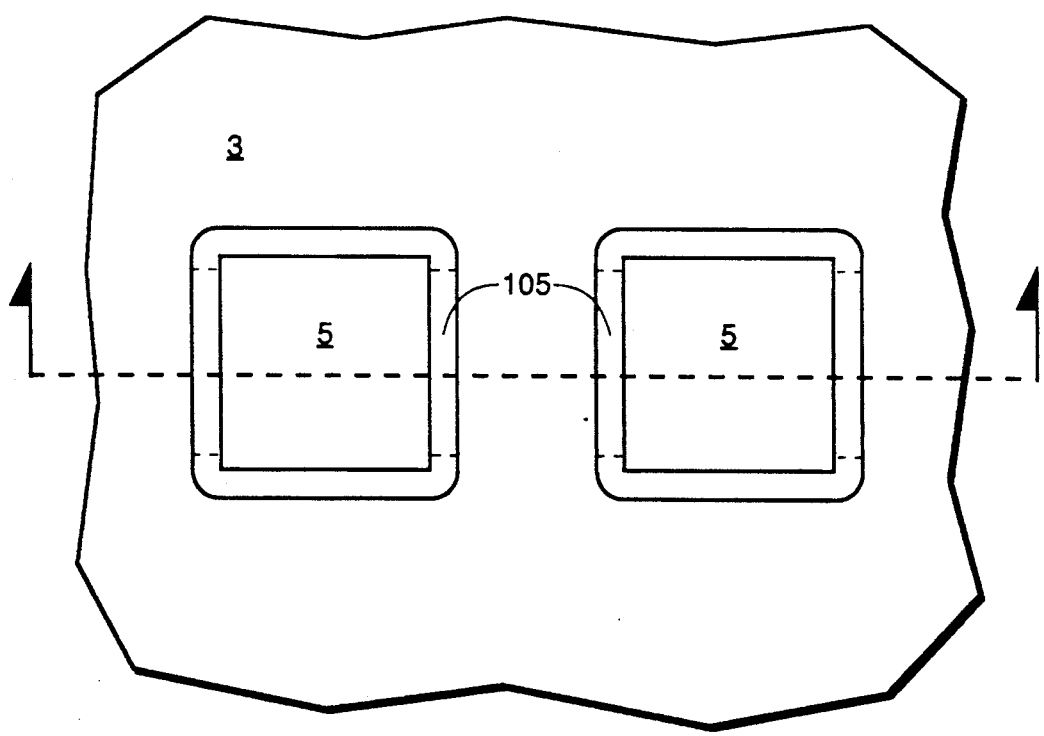

FIGS. 29A and 29B depict narrow isolated trenches 100 fabricated according to the trench mask 85 as shown in FIGS. 28A and 28B. The narrow isolated trenches 100 have been filled with oxide 105.

Although variations to the invention as described are possible, it will be apparent to one of ordinary skill in the art that changes may be made thereto without departing from the spirit and the scope of the process as claimed.

We claim:

1. A process for creating an etch mask having isolated spacings, said isolated spacings, said process for creating the etch mask comprising the following steps:
   a) creating a mask island on starting substrate, said island having a first pair of opposing exterior walls and a second pair of opposing exterior walls;
   b) blanket depositing a spacer layer overlying said starting substrate and said mask island, said spacer layer being etchable with a significant degree of selectivity over said mask island, said spacer layer having a given thickness which substantially corresponds to a desired width of the isolated spacings, said spacer layer having a first pair of opposing ends and a second pair of opposing ends, said first pair of opposing ends adjacent to said first pair of opposing exterior walls and said second pair of opposing ends adjacent to said second pair of opposing exterior walls, said first and second pairs of opposing ends having a width equal to the given thickness;
   c) blanket depositing a protective layer overlying said spacer layer, said spacer layer capable of being distinctly etchable over said protective layer;
   d) removing at least a portion of said protective layer to a level at or below an initial top surface of said spacer layer to expose a first portion of said spacer layer, a second portion of the spacer layer at a distance from the island greater than said given thickness remaining covered by a remaining portion of said protective layer;
   e) masking said first pair of opposing ends, said second pair of opposing ends and said first portion of said spacer layer interposed between said second pair of opposing ends remaining exposed; and
   f) removing said spacer layer remaining exposed subsequent to said masking said first pair of opposing ends to create the etch mask having the isolated spacings, each of the isolated spacings having an inner wall and an outer wall, each of said inner walls self aligned to one of said opposing walls of said second pair of opposing walls, and said outer walls self aligned to said remaining portion of said protective layer and said second portion of said spacer layer, said isolated spacings having said desired width.

2. The process as specified in claim 1, further comprising exposing said starting substrate in exposed areas defined by the etch mask, each of said exposed areas self aligned to one of said opposing walls of said second pair of opposing walls and each of said exposed area self-aligned to said remaining portion of said protective layer and said second portion of said spacer layer, said exposed areas having said desired width.

3. The process of claim 2, further comprising etching said starting substrate in said exposed areas to form isolated trenches in said starting substrate, said etch mask providing a pattern for said etching such that said isolated trenches have a width substantially equal to the given thickness of said spacer layer, said etching terminated in order to eliminate etching of said starting substrate underlying said second portion of said spacer layer.

4. The process of claim 3, further comprising oxidizing at least said isolated trenches with oxide 5. The process of claim 4, wherein said oxidizing comprises thermally growing oxide from sidewalls of said isolated trenches.

6. The process of claim 4, wherein said oxidizing comprises depositing oxide in said isolated trenches.

7. The process of claim 4, further comprising removing excess portions of said oxide while retaining said oxide in said isolated trenches.

8. The process as specified in claim 7, wherein said removing said excess portions of said oxide further comprises:
 a) planarizing said oxide; and
 b) dipping off said oxide.

9. The process as specified in claim 1, further comprising fabricating a plurality of mask islands according to steps a)–f) of claim 1, said fabricating creating a total of said isolated spacings equal to twice a total of said mask islands of said plurality.

10. The process of claim 1, wherein said creating said mask island further comprises the following steps:
 a) depositing a base layer overlying said starting substrate;
 b) patterning said base layer with photoresist; and
 c) anisotropically etching said base layer to create said mask island.

11. The process of claim 1, wherein said creating said mask island further comprises the following steps:
 a) oxidizing said starting substrate to form a thin oxidized layer of substrate overlying said starting substrate;
 b) depositing a nitride layer overlying said oxidized layer of substrate;
 c) depositing a base layer overlying said nitride layer;
 d) patterning the base layer with photoresist;
 e) a first anisotropic etching of said base layer according to said patterning;
 f) a second anisotropic etching of said nitride layer according to said patterning, said first and second etchings creating a mask island of said nitride and said base layer; and
 g) reoxidizing said starting substrate to replenish any portions of said oxidized layer of substrate removed during said first and second etchings.

12. The process of claim 11, further comprising exposing said starting substrate in areas defined by the etch mask by overetching said oxidized substrate to form exposed areas, each of said exposed areas self aligned to one of said opposing walls of said second pair of opposing walls and to said remaining portion of said protective layer and said second portion of said spacer layer.

13. The process of claim 11, wherein said oxidizing further comprises elevating a temperature of said starting substrate.

14. The process of claim 11, where said depositing said nitride layer further comprises depositing said nitride by a low pressure chemical vapor deposition.

15. The process of claim 11, wherein said patterning further comprises depositing a photoresist.

16. The process of claim 11, wherein said base layer is silicon dioxide.

17. The process of claim 1, wherein said removing at least a portion of said protective layer further comprises:
 a) depositing a planarized layer of photoresist resin overlying said protective layer; and
 b) etching said photoresist resin layer and said protective layer, and etch rate of said photoresist resin layer and an etch rate of said protective layer being substantially the same.

18. The process of claim 17, wherein removing at least a portion of said protective layer further comprises etching said photoresist resin and said protective layer using an isotropic plasma etch.

19. The process of claim 1, wherein said removing at least a portion of said protective layer further comprises planarizing at least said protective layer.

20. The process of claim 1, wherein said removing said spacer layer further comprises etching said spacer layer isotopically.

21. The process of claim 1, wherein said spacer layer is polycrystalline silicon.

22. The process of claim 1, wherein said protective layer is an oxide.

23. The process of claim 1, wherein said depositing said spacer layer further comprises depositing said spacer layer by a low pressure chemical vapor deposition.

24. The process of claim 1, wherein said depositing said protective layer further comprises depositing said protective layer by a low pressure chemical vapor deposition.

25. The process of claim 1, wherein said depositing said protective layer further comprising depositing said protective layer by tetra ethyl ortho silicate.

* * * * *